(12) United States Patent
Kubo et al.

(10) Patent No.: US 10,658,377 B2
(45) Date of Patent: May 19, 2020

(54) THREE-DIMENSIONAL MEMORY DEVICE WITH REDUCED ETCH DAMAGE TO MEMORY FILMS AND METHODS OF MAKING THE SAME

(71) Applicant: SANDISK TECHNOLOGIES LLC, Addison, TX (US)

(72) Inventors: Tomohiro Kubo, Yokkaichi (JP); Koji Miyata, Yokkaichi (JP); Kota Funayama, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/019,677

(22) Filed: Jun. 27, 2018

(65) Prior Publication Data

US 2020/0006373 A1    Jan. 2, 2020

(51) Int. Cl.
| | |
|---|---|
| *H01L 27/11582* | (2017.01) |
| *H01L 27/1157* | (2017.01) |
| *H01L 21/768* | (2006.01) |
| *H01L 27/11573* | (2017.01) |

(52) U.S. Cl.
CPC .... *H01L 27/11582* (2013.01); *H01L 21/7688* (2013.01); *H01L 27/1157* (2013.01); *H01L 27/11573* (2013.01)

(58) Field of Classification Search
CPC ....... H01L 2924/1438; H01L 27/11582; H01L 27/11556; H01L 27/11551; H01L 27/11521; H01L 27/11568
See application file for complete search history.

(56) References Cited

U.S. PATENT DOCUMENTS

| | | | |
|---|---|---|---|
| 5,915,167 | A | 6/1999 | Leedy |
| 8,455,940 | B2 | 6/2013 | Lee et al. |
| 8,884,357 | B2 | 11/2014 | Wang et al. |
| 8,946,023 | B2 | 2/2015 | Makala et al. |
| 9,224,752 | B1 | 12/2015 | Lee et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Cuong Q Nguyen
*Assistant Examiner* — Shih Tsun A Chou
(74) *Attorney, Agent, or Firm* — The Marbury Law Group PLLC

(57) ABSTRACT

A first memory film and a sacrificial fill structure are formed within each first-tier memory opening through a first alternating stack of first insulating layers and first spacer material layers. A second alternating stack of second insulating layers and second spacer material layers is formed over the first alternating stack, and a second-tier memory opening is formed over each sacrificial fill structure. A second memory film is formed in each upper opening, and the sacrificial fill structures are removed from underneath the second-tier memory openings to form memory openings. A semiconductor channel is formed on each vertically neighboring pair of a first memory film and a second memory film as a continuous layer. The first memory film is protected by the sacrificial fill structure during formation of the second-tier memory openings.

6 Claims, 34 Drawing Sheets

(56) References Cited

U.S. PATENT DOCUMENTS

| | | | |
|---|---|---|---|
| 9,230,987 | B2 | 1/2016 | Pachamuthu et al. |
| 9,343,358 | B1 | 5/2016 | Xu |
| 9,502,471 | B1 | 11/2016 | Lu et al. |
| 9,570,463 | B1 | 2/2017 | Zhang et al. |
| 9,627,403 | B2 | 4/2017 | Liu et al. |
| 9,728,551 | B1 | 8/2017 | Lu et al. |
| 9,768,192 | B1 | 9/2017 | Nakamura |
| 9,780,034 | B1 | 10/2017 | Tsutsumi et al. |
| 2011/0063910 | A1* | 3/2011 | Maejima .................. G11C 5/02 365/185.11 |
| 2011/0287612 | A1 | 11/2011 | Lee et al. |
| 2012/0001247 | A1 | 1/2012 | Alsmeier |
| 2015/0016242 | A1 | 1/2015 | Ernstrom et al. |
| 2015/0155296 | A1 | 4/2015 | Yoon |
| 2015/0294978 | A1 | 10/2015 | Lu et al. |
| 2016/0005760 | A1* | 1/2016 | Lee .................. H01L 27/11582 257/324 |
| 2017/0062454 | A1 | 3/2017 | Lu et al. |
| 2017/0229472 | A1 | 8/2017 | Lu et al. |
| 2017/0236835 | A1 | 8/2017 | Nakamura et al. |
| 2017/0243879 | A1 | 8/2017 | Yu et al. |
| 2017/0271261 | A1 | 9/2017 | Tsutsumi et al. |
| 2017/0271352 | A1 | 9/2017 | Nakamura |
| 2018/0006049 | A1 | 1/2018 | Inomata et al. |
| 2018/0182771 | A1 | 6/2018 | Costa et al. |

OTHER PUBLICATIONS

Hammond, M. L., "Silicon Epitaxy by Chemical Vapor Deposition," pp. 45-106.

Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

Seidel, H. et al., "Anisotropic Etching of Crystalline Silicon in Alkaline Solutions," J. Electrochem. Soc., vol. 137, No. 11, pp. 3612-3626, (1990).

Non-Final Office Communication for U.S. Appl. No. 15/071,575, dated Nov. 16, 2016, 13 pages.

Invitation to Pay Additional Fees from the International Searching Authority for International Patent Application No. PCT/US2017/017823, dated May 4, 2017, 18 pages.

International Application No. PCT/US2017/017823, International Search Report and Written Opinion, dated Jul. 5, 2017, 24pgs.

U.S. Appl. No. 15/593,820, filed May 12, 2017, Sandisk Technologies LLC.

U.S. Appl. No. 15/632,983, filed Jun. 26, 2017, Sandisk Technologies LLC.

U.S. Appl. No. 15/681,886, filed Aug. 31, 2017, Sandisk Technologies LLC.

U.S. Appl. No. 15/914,560, filed Mar. 7, 2018, Sandisk Technologies LLC.

* cited by examiner

THREE-DIMENSIONAL MEMORY DEVICE WITH REDUCED ETCH DAMAGE TO MEMORY FILMS AND METHODS OF MAKING THE SAME

FIELD

The present disclosure relates generally to the field of three-dimensional memory devices and specifically to three-dimensional memory devices with reduced etch damage to memory films and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises: a first alternating stack of first insulating layers and first electrically conductive layers located over a top surface of a substrate; an insulating cap layer overlying the first alternating stack; a second alternating stack of second insulating layers and second electrically conductive layers overlying the insulating cap layer; a memory opening extending through the second alternating stack, the insulating cap layer, and the first alternating stack; and a memory stack structure located within the memory opening and comprising a semiconductor channel, a first memory film laterally surrounding the semiconductor channel and embedded within the first alternating stack, and a second memory film laterally surrounding semiconductor channel and embedded within the second alternating stack, wherein the second memory film is not in direct contact with the first memory film.

According to another aspect of the present disclosure, a method of forming a three-dimensional memory device is provided, which comprises: forming a first alternating stack of first insulating layers and first spacer material layers over a substrate; forming a first-tier memory opening through the first alternating stack; forming a first memory film and a sacrificial fill structure in the first-tier memory opening; forming a second alternating stack of second insulating layers and second spacer material layers over the second insulating cap layer; forming a second-tier memory opening through the second alternating stack and over the sacrificial fill structure; forming a second memory film at a periphery of the second-tier memory opening; removing the sacrificial fill structure underneath the second-tier memory opening to form a memory opening; and forming a semiconductor channel on the first memory film and the second memory film.

DETAILED DESCRIPTION

Figure 1:
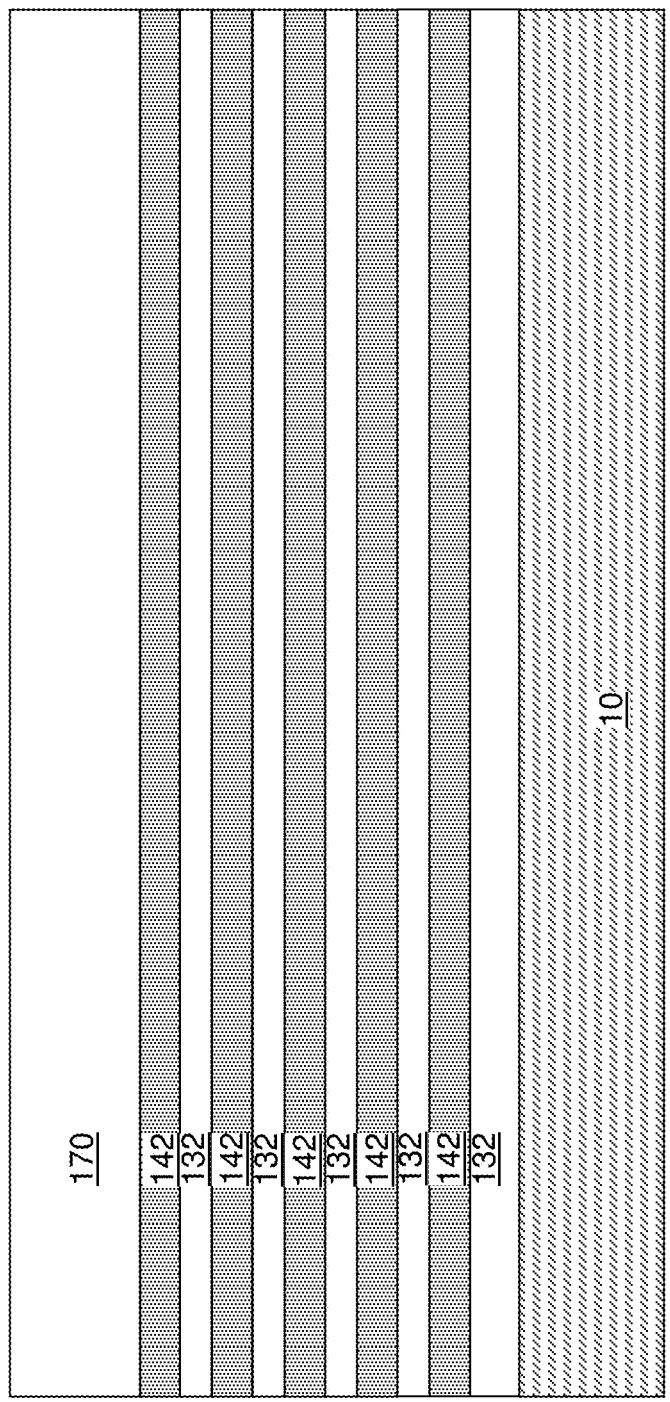
FIG. 1 is a vertical cross-sectional view of a first exemplary structure after formation of a first alternating stack of first insulating layers and first sacrificial material layers and formation of an overlying first insulating cap layer according to a first embodiment of the present disclosure.

In case a three-dimensional memory device includes multiple tiers, etch damage introduced to a lower tier memory film during patterning of an upper tier memory film can cause electrical shorts and/or leakage current degradation. The embodiments of the present disclosure are directed to three-dimensional memory devices with reduced etch damage to memory films and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 10. The substrate semiconductor layer 10 can be a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 10 can comprise a single crystalline semiconductor material, such as a single crystal silicon wafer.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10. While the substrate semiconductor layer 10 is alternatively referred to as the substrate 10 in the present disclosure, it is understood that the substrate 10 may optionally include additional material layers (such as a handle substrate and a buried insulator layer as in the case of a semiconductor-on-insulator substrate).

The first exemplary structure includes a memory array region, in which memory devices can be subsequently formed, and a contact region (not shown), in which stepped surfaces are subsequently formed. As used herein, a "contact region" refers to a region in which contact via structures are to be formed. At least one semiconductor device for a peripheral circuitry can be formed in a peripheral device region (not shown). The at least one semiconductor device can include, for example, one or more field effect transistors. The least one semiconductor device for the peripheral circuitry can contain a driver circuit for memory devices to be subsequently formed, which can include at least one NAND device.

Optionally, a doped semiconductor well (not separately shown) can be provided in an upper portion of the substrate semiconductor layer 10. The doped semiconductor well can be formed, for example, by implantation of electrical dopants (p-type dopants or n-type dopants) into an upper portion of the substrate semiconductor layer 10, or by deposition of a single crystalline semiconductor material, for example, by selective epitaxy. In one embodiment, the doped semiconductor well can include a single crystalline semiconductor material (e.g., p-well).

An alternating stack of first material layers and second material layers is subsequently formed. Each first material layer can include a first material, and each second material layer can include a second material that is different from the first material. The alternating stack is herein referred to as a first alternating stack. The first material layers can be first insulating layers 132, and the second material layers can be first spacer material layers that vertically separate each neighboring pair of first insulating layers 132. The first spacer material layers may be formed as first electrically conductive layers, or may be formed as first sacrificial material layers that are subsequently replaced with first electrically conductive layers. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the substrate semiconductor layer 10, which is a portion of a substrate. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142. A first insulating cap layer 170 is sequentially formed. The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 2:
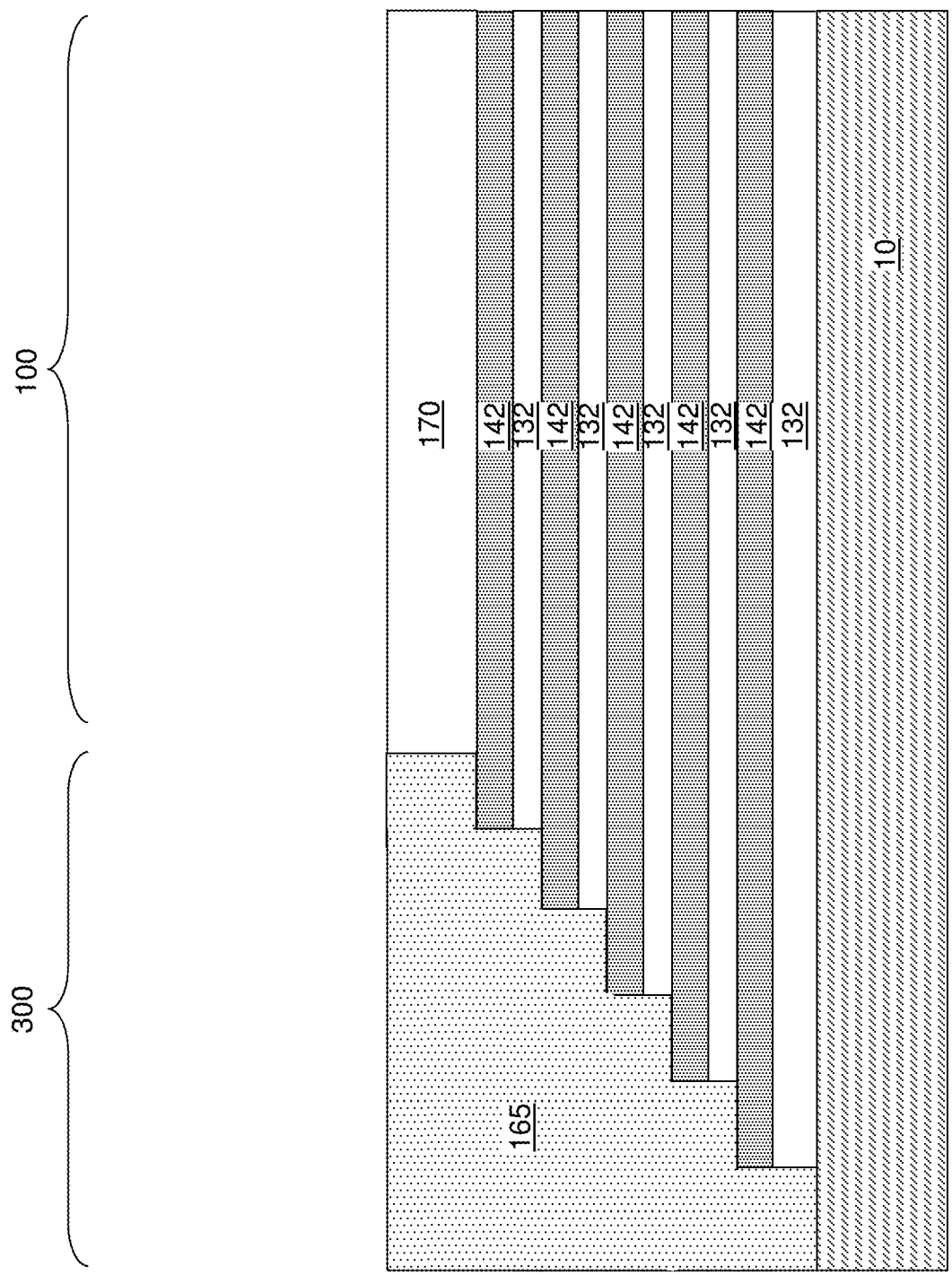
FIG. 2 is a vertical cross-sectional view of the first exemplary structure after formation of first stepped surfaces and a first retro-stepped dielectric material portion according to the first embodiment of the present disclosure.

Referring to FIG. 2, the first insulating cap layer 170 and the first alternating stack (132, 142) can be patterned to form first stepped surfaces in a contact region (not shown). The contact region includes a first stepped area in which the first stepped surfaces are formed, and a second stepped area in which additional stepped surfaces are to be subsequently formed in a second-tier structure (to be subsequently formed over a first-tier structure). The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first retro-stepped dielectric material portion (not shown). As used herein, a "retro-stepped" element refers to an element that has stepped surfaces and a horizontal cross-sectional area that increases monotonically as a function of a vertical distance from a top surface of a substrate on which the element is present.

Figure 3:
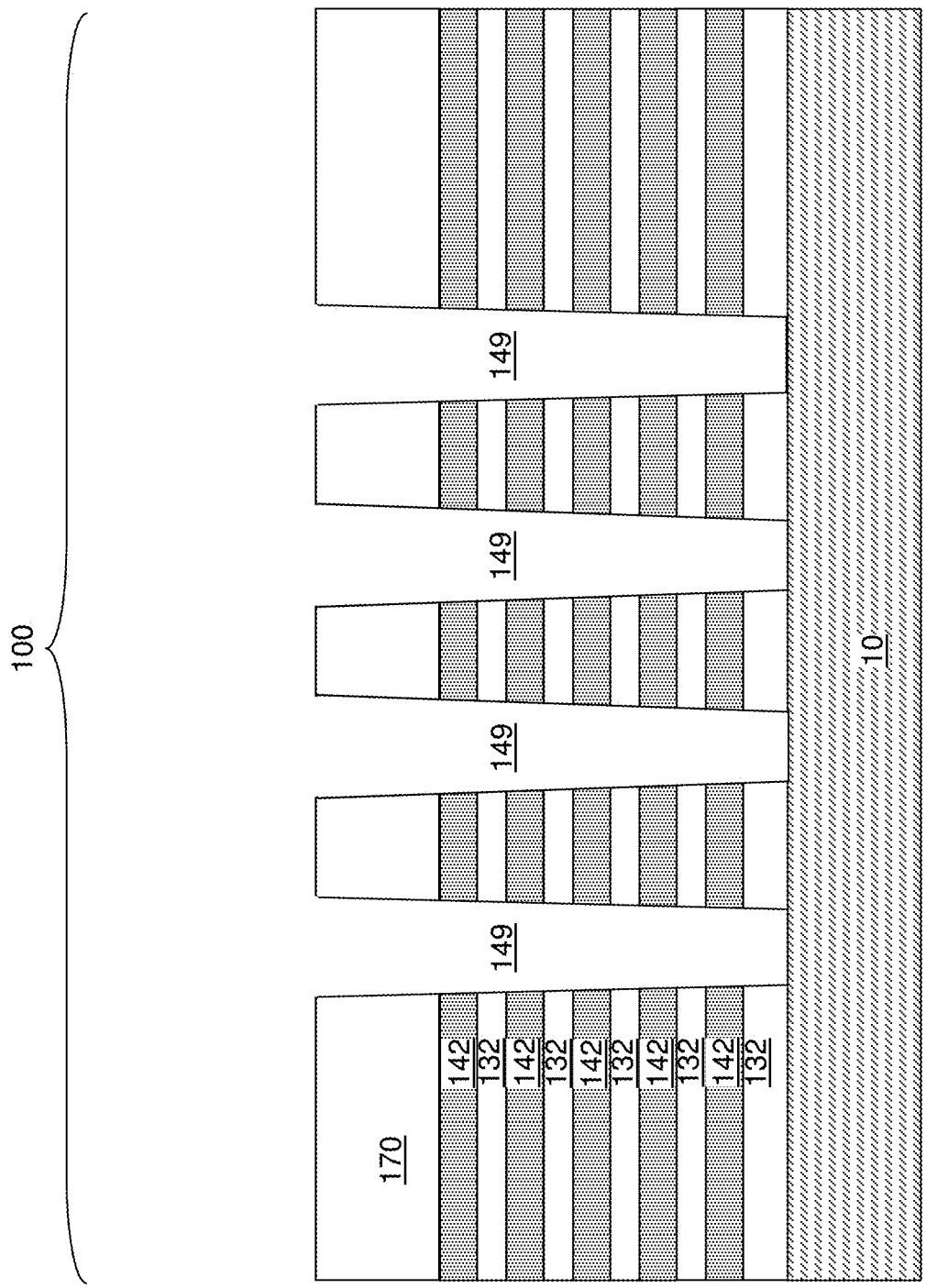
FIG. 3 is a vertical cross-sectional view of the first exemplary structure after formation of first-tier memory openings according to the first embodiment of the present disclosure.

Referring to FIG. 3, first-tier memory openings 149 extending to a top surface of the substrate 10 are formed through the first alternating stack (132, 142). The first-tier memory openings 149 can be formed in the memory array region 100. For example, a lithographic material stack (not shown) including at least a photoresist layer can be formed over the first insulating cap layer 170, and can be lithographically patterned to form openings within the lithographic material stack. The pattern in the lithographic material stack can be transferred through the first insulating cap layer 170 and through the entirety of the first alternating stack (132, 142) by at least one anisotropic etch that employs the patterned lithographic material stack as an etch mask. Portions of the first insulating cap layer 170 and the first alternating stack (132, 142) underlying the openings in the patterned lithographic material stack are etched to form the first-tier memory openings 149. In one embodiment, the chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches. The sidewalls of the first-tier memory openings 149 can be substantially vertical, or can be tapered. Subsequently, the patterned lithographic material stack can be subsequently removed, for example, by ashing.

Figure 4:
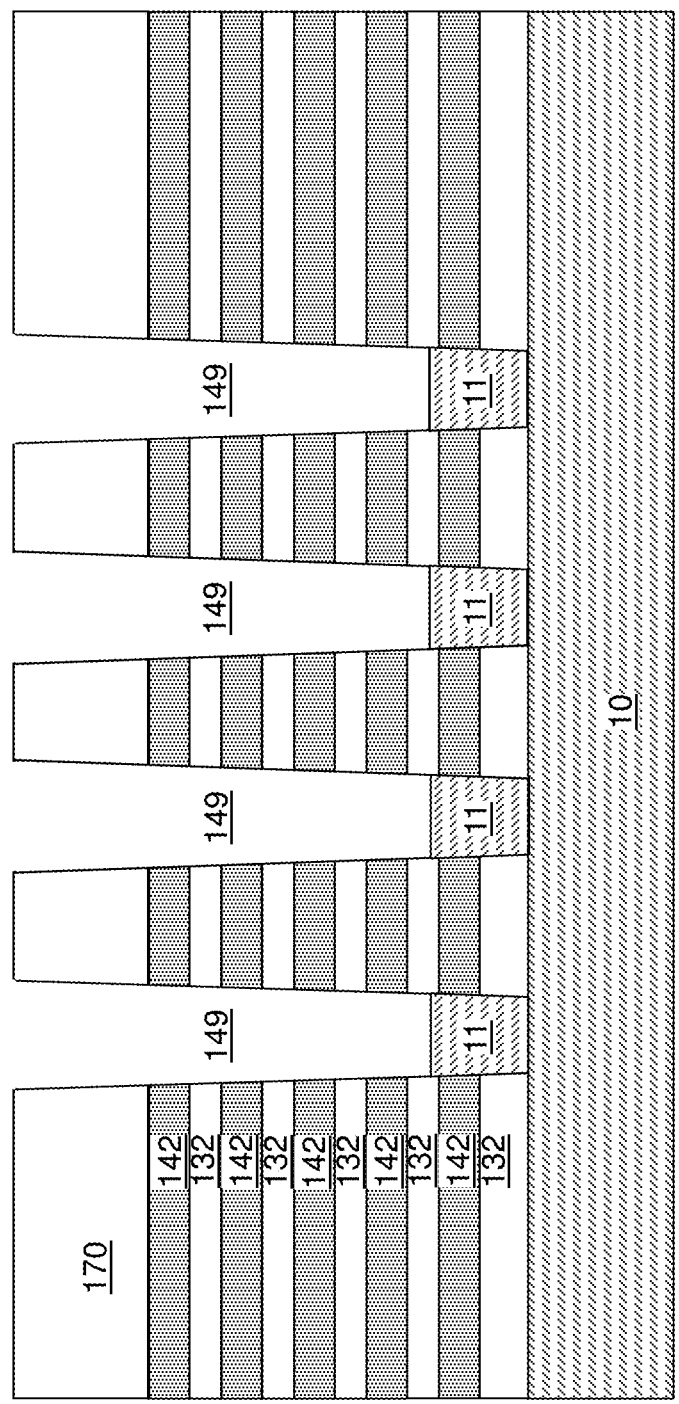
FIG. 4 is a vertical cross-sectional view of the first exemplary structure after formation of optional pedestal channel portions according to the first embodiment of the present disclosure.

Referring to FIG. 4, a selective epitaxy process can be performed to deposit a semiconductor material on physically exposed semiconductor surfaces. Specifically, pedestal channel portions 11 can grow from the semiconductor surfaces at the bottom of the first-tier memory openings 149 during the selective epitaxy process. The pedestal channel portions 11 comprise a single crystalline semiconductor material in epitaxial alignment with the single crystalline substrate semiconductor material of the substrate semiconductor layer 10.

In one embodiment, the deposited semiconductor material may be doped with in-situ doping of a p-type dopant or an n-type dopant. Thus, the pedestal channel portions 11 can be doped with electrical dopants of a suitable conductivity type. In one embodiment, the substrate semiconductor layer 10 and the pedestal channel portions 11 can have a doping of the first conductivity type (e.g., p-type). The pedestal channel portions 11 may comprise silicon.

The selective epitaxy process can be performed, for example, by sequentially or simultaneously flowing a reactant gas (such as $SiH_4$, $SiH_2Cl_2$, $SiHCl_3$, $SiCl_4$, $Si_2H_6$, other semiconductor precursor gases, or combinations there) with an etchant gas (such as HCl). The deposition rate of the semiconductor material on amorphous surfaces (such as the surfaces of dielectric materials) is less than the etch rate of the semiconductor material by the etchant, while the deposition rate of the semiconductor material on crystalline surfaces (such as the top surface of the substrate semiconductor layer 10) is greater than the etch rate of the semiconductor material by the etchant. Thus, the semiconductor material is deposited only on the semiconductor surface, which is the physically exposed portion of the top surface of the substrate semiconductor layer 10. The process conditions (such as the deposition temperature, the partial pressure of the various gases in a process chamber, etc.) can be selected such that the deposited semiconductor material is epitaxial, i.e., single crystalline silicon or another semiconductor material with atomic alignment with the single crystalline structure of the substrate semiconductor layer 10

(e.g., p-well). Each pedestal channel portion 11 can be formed at a bottom portion of a respective first-tier memory opening 149.

Optionally, a thermal oxidation process or a plasma oxidation process may be performed to oxidize a surface portion of each pedestal channel portion 11, thereby converting the surface portion into a respective semiconductor oxide portion (not illustrated). The thickness of a semiconductor oxide portion can be in a range from 1 nm to 10 nm, although lesser and greater thicknesses can also be employed.

Figure 5:
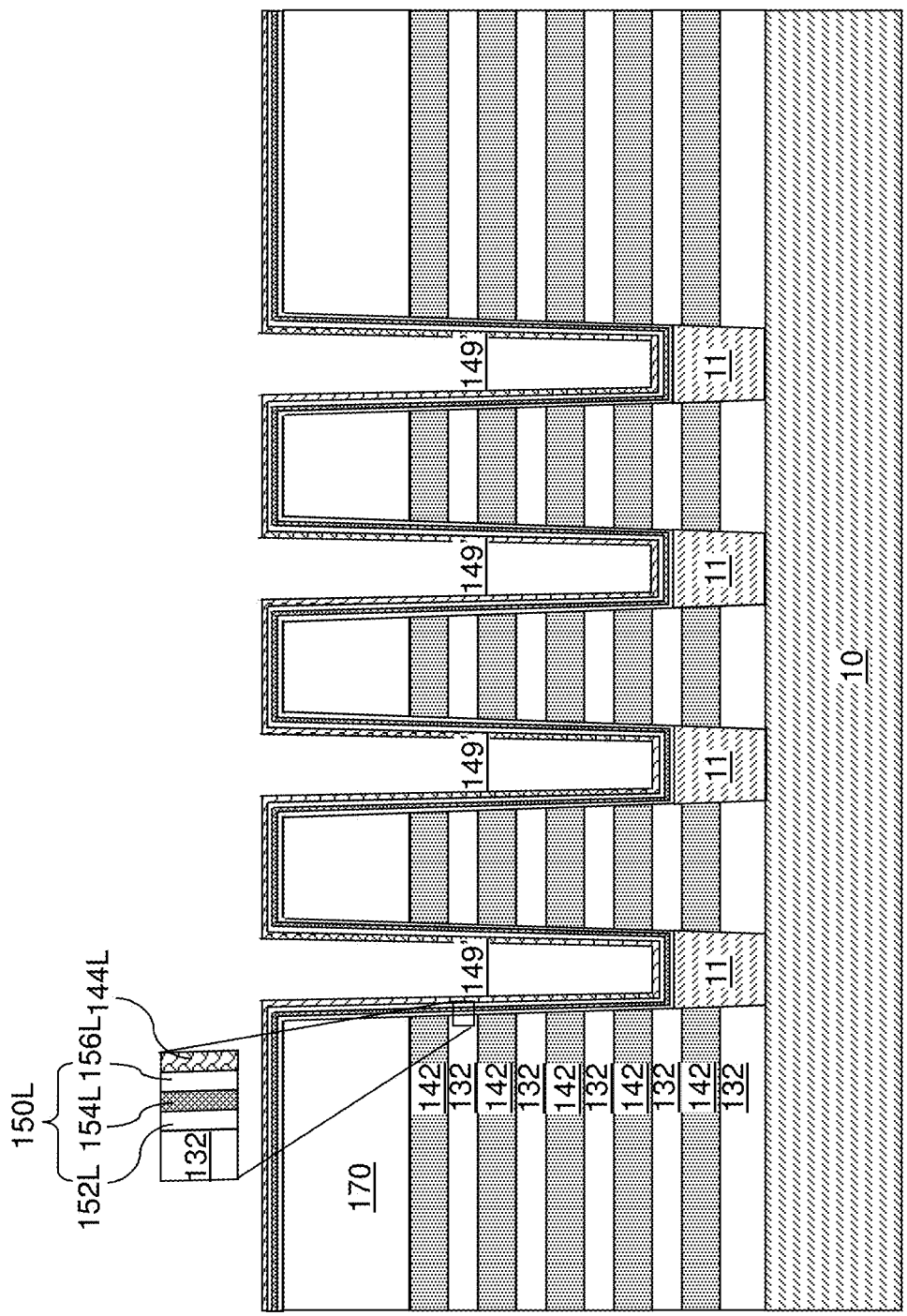
FIG. 5 is a vertical cross-sectional view of the first exemplary structure after formation of a first memory film layer and a first cover material layer according to the first embodiment of the present disclosure.

Referring to FIG. 5, a first memory film layer 150L can be deposited conformally in remaining volumes of the first-tier memory openings 149 and over the first insulating cap layer 170. If first-tier support openings are present in the contact region, the first memory film layer 150L can be deposited in the first-tier support openings. The first memory film layer 150L includes a first blocking dielectric layer 152L, a first continuous charge storage layer 154L, and a first tunneling dielectric layer 156L.

The first blocking dielectric layer 152L can include a single dielectric material layer or a stack of a plurality of dielectric material layers. In one embodiment, the first blocking dielectric layer 152L can include silicon oxide and/or a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 152L can include a dielectric metal oxide having a dielectric constant greater than 7.9, i.e., having a dielectric constant greater than the dielectric constant of silicon nitride. The first blocking dielectric layer 152L can have a thickness in a range from 3 nm to 20 nm, although lesser and greater thicknesses can also be employed.

The first continuous charge storage layer 154L can be subsequently formed. In one embodiment, the first continuous charge storage layer 154L can be a continuous layer of a charge trapping material including a dielectric charge trapping material, which can be, for example, silicon nitride. The first continuous charge storage layer 154L can be formed, for example, by chemical vapor deposition (CVD), atomic layer deposition (ALD), physical vapor deposition (PVD), or any suitable deposition technique for storing electrical charges therein. The thickness of the first continuous charge storage layer 154L can be in a range from 2 nm to 20 nm, although lesser and greater thicknesses can also be employed.

The first tunneling dielectric layer 156L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The first tunneling dielectric layer 156L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the first tunneling dielectric layer 156L can include a stack of a first silicon oxide layer, a silicon oxynitride layer, and a second silicon oxide layer, which is commonly known as an ONO stack. In one embodiment, the first tunneling dielectric layer 156L can include a silicon oxide layer that is substantially free of carbon or a silicon oxynitride layer that is substantially free of carbon. The thickness of the first tunneling dielectric layer 156L can be in a range from 2 nm to 20 nm, although lesser and greater thicknesses can also be employed.

A first cover material layer 144L can be subsequently deposited by a conformal deposition process over the first memory film layer 150L. The first cover material layer 144L can include amorphous semiconductor material (such as amorphous silicon) or a carbon-based material (such as amorphous carbon or diamond-like carbon (DLC)). The thickness of the first cover material layer 144L can be in a range from 1 nm to 10 nm, although lesser and greater thicknesses can also be employed. A first memory cavity 149' can be present within each unfilled volume of the first-tier memory opening 149.

Figure 6:
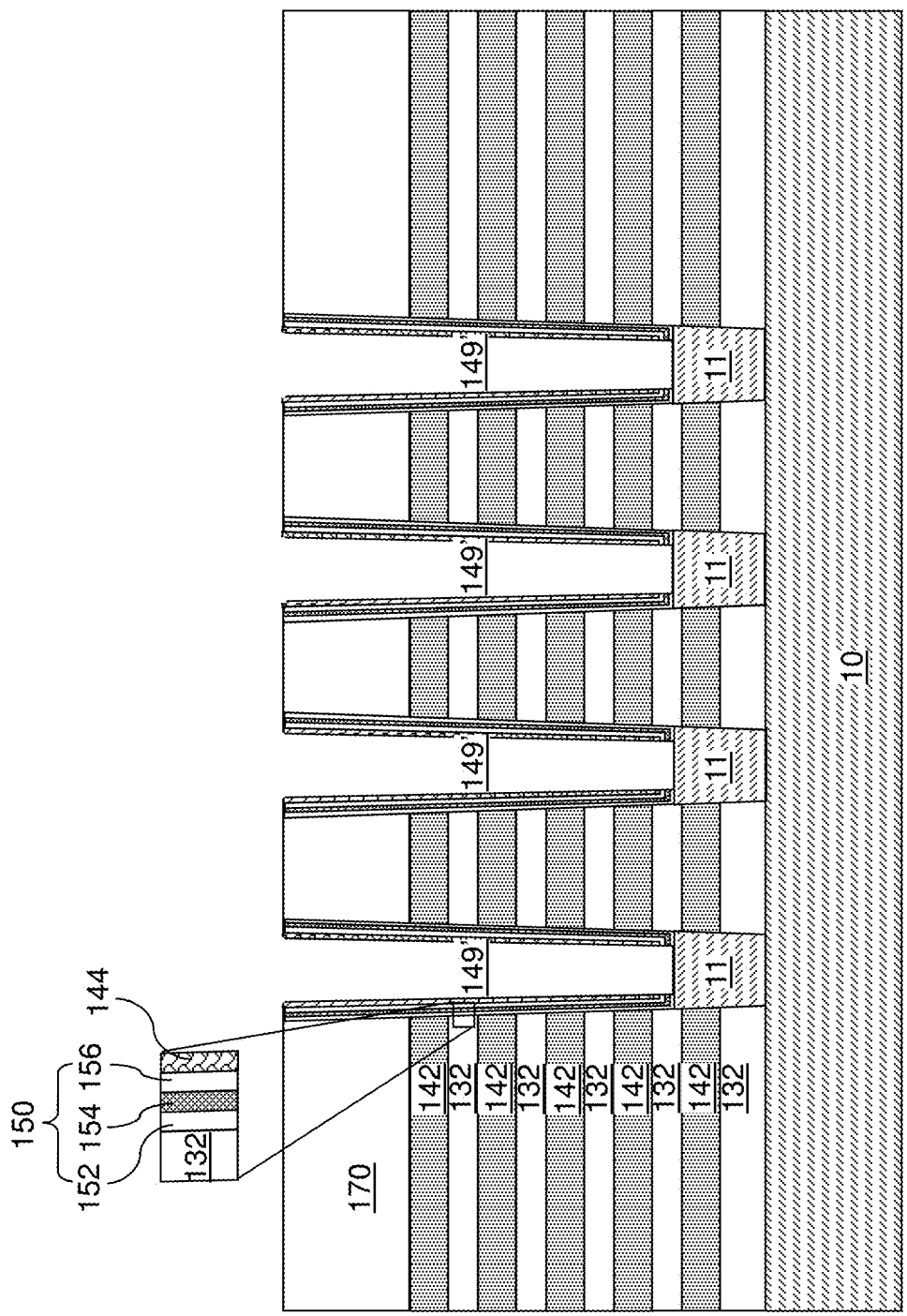
FIG. 6 is a vertical cross-sectional view of the first exemplary structure after anisotropically etching the first continuous cover material layer and the first memory film layer according to the first embodiment of the present disclosure.

Referring to FIG. 6, horizontal portions of the first cover material layer 144L and the first memory film layer 150L are removed by an anisotropic etch process. The removal of the horizontal portions of the first cover material layer 144L and the first memory film layer 150L at the bottom of the first-tier memory openings 149 is relatively easy at this point in the process because the openings 149 are relatively shallow and have a relatively low aspect ratio before the second tier is formed over the first tier. Each remaining portion of the first memory film layer 150L within the first-tier memory openings 149 constitutes a first memory film 150. Each first memory film 150 can have a respective tubular shape in which the sidewalls have a zero or non-zero taper angle with respect to a vertical direction (which may be less than 10 degrees). Each first memory film 150 can include a nested stack of a first blocking dielectric 152, a first charge storage layer 154, and a first tunneling dielectric 156. Thus, each first memory film 150 comprises, from outside to inside, a first blocking dielectric 152, a first charge storage layer 154, and a first tunneling dielectric 156. Each first blocking dielectric 152 can be a remaining tubular portion of the first blocking dielectric layer 152L, each first charge storage layer 154 can be a remaining tubular portion of the first continuous charge storage layer 154L, and each first tunneling dielectric 156 can be a remaining tubular portion of the first tunneling dielectric layer 156L. Remaining cylindrical portions of the first cover material layer 144L constitute first cover material tubes 144, each of which can have a respective tubular shape and protect a respective memory film 150 during the anisotropic etch process.

Figure 7:
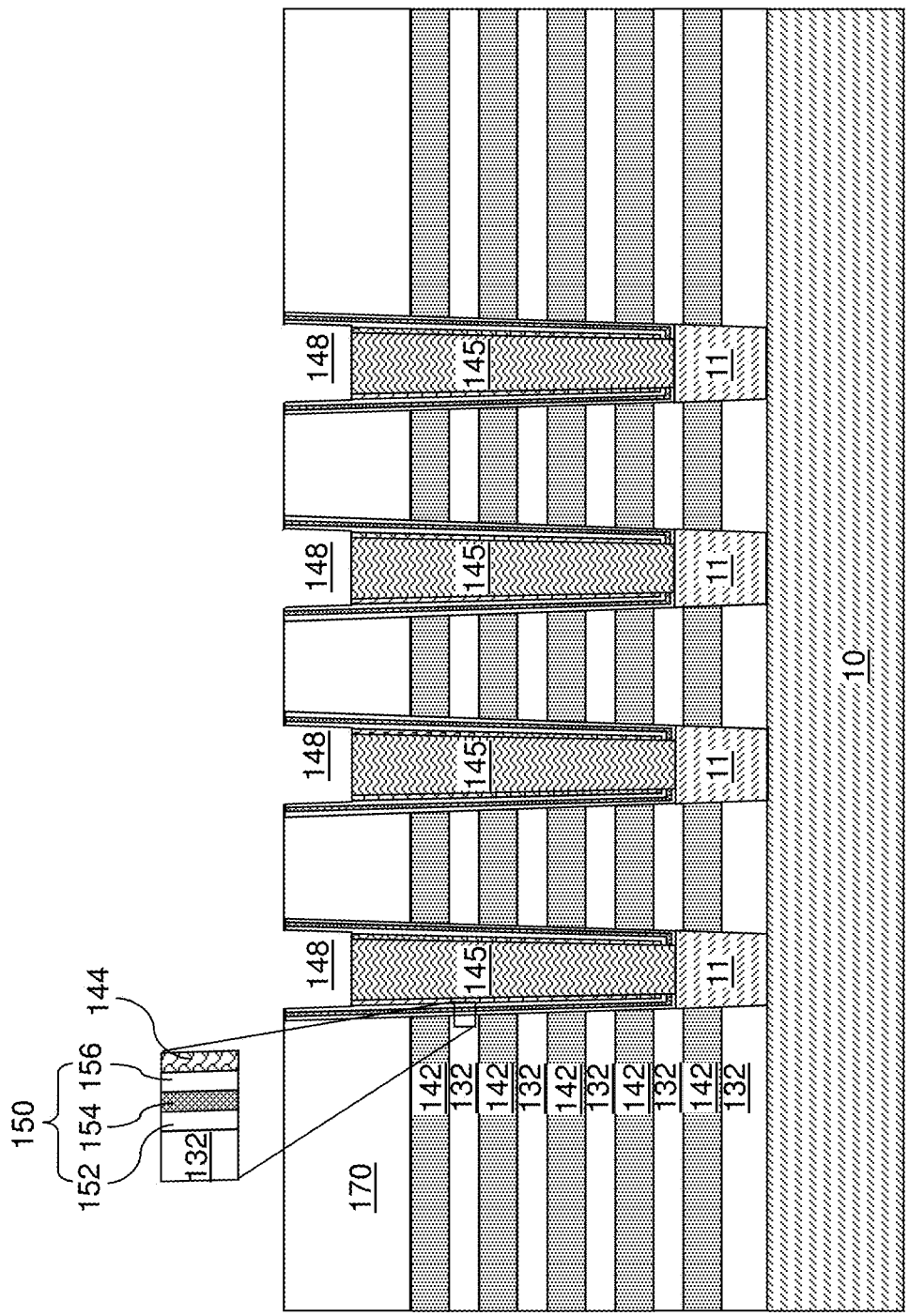
FIG. 7 is a vertical cross-sectional view of the first exemplary structure after formation of a sacrificial fill structure within each first-tier memory opening according to the first embodiment of the present disclosure.

Referring to FIG. 7, a first sacrificial fill material can be deposited in the first memory cavities 149' over the pedestal channel portions 11 in the first-tier memory openings 149. The first sacrificial fill material includes a temporary material, i.e., a sacrificial material, which is subsequently removed selective to the pedestal channel portions and selective to the first cover material tubes 144 or the first memory films 150. In one embodiment, the first sacrificial fill material can include amorphous carbon, diamond-like carbon (DLC), amorphous silicon, a silicon-germanium alloy, a silicate glass having a higher etch rate than undoped silicate glass (such as borosilicate glass, porous or non-porous organosilicate glass, or a flowable oxide (FOX)), or a silicon-based polymer. In one embodiment, the first sacrificial fill material can include an undoped semiconductor material such as an undoped silicon-germanium alloy having 25 to 90 atomic percent germanium, such as 35 to 85 atomic percent germanium. As used herein, an "undoped" semiconductor material refers to a semiconductor material that is intrinsic, or not intentionally doped, and thus, having a low dopant concentration such as less than $1.0 \times 10^{17}/cm^3$. The first sacrificial fill material may be formed by a non-conformal deposition or a conformal deposition method. In one embodiment, a cavity may be formed inside one or more of the first-tier memory openings 149 in case a non-conformal deposition method is employed to deposit the first sacrificial fill material.

In one embodiment, excess portions of the first sacrificial fill material can be recessed below the horizontal plane including the top surface of the first insulating cap layer 170 by a recess etch process to form cavities. If the first sacrificial fill material comprises silicon-germanium, then a SC-1 etching solution (e.g., an aqueous solution containing ammonia water and hydrogen peroxide) can be used to etch the first sacrificial fill material. For example, the SC-1 etching solution can include a 1:1 (28% $NH_4OH$)/(31% $H_2O_2$) solution in deionized water. Such a solution has an etch rate selectivity of greater than 20,000 for silicon-germanium containing about 80 atomic percent germanium compared to the underlying amorphous silicon first cover material tube 144. Each remaining portion of the first sacrificial fill material in the first memory openings 149 constitutes a lower sacrificial fill material portion 145. In one embodiment, a top surface of each lower sacrificial fill material portion 145 can be formed between the horizontal plane including the top surface of the first insulating cap layer 170 and the horizontal plane including the bottom surface of the first insulating cap layer 170. Optionally, a top portion of each first cover material tube 144 may be vertically recessed below the horizontal plane including the top surface of the first insulating cap layer 170.

Figure 8:
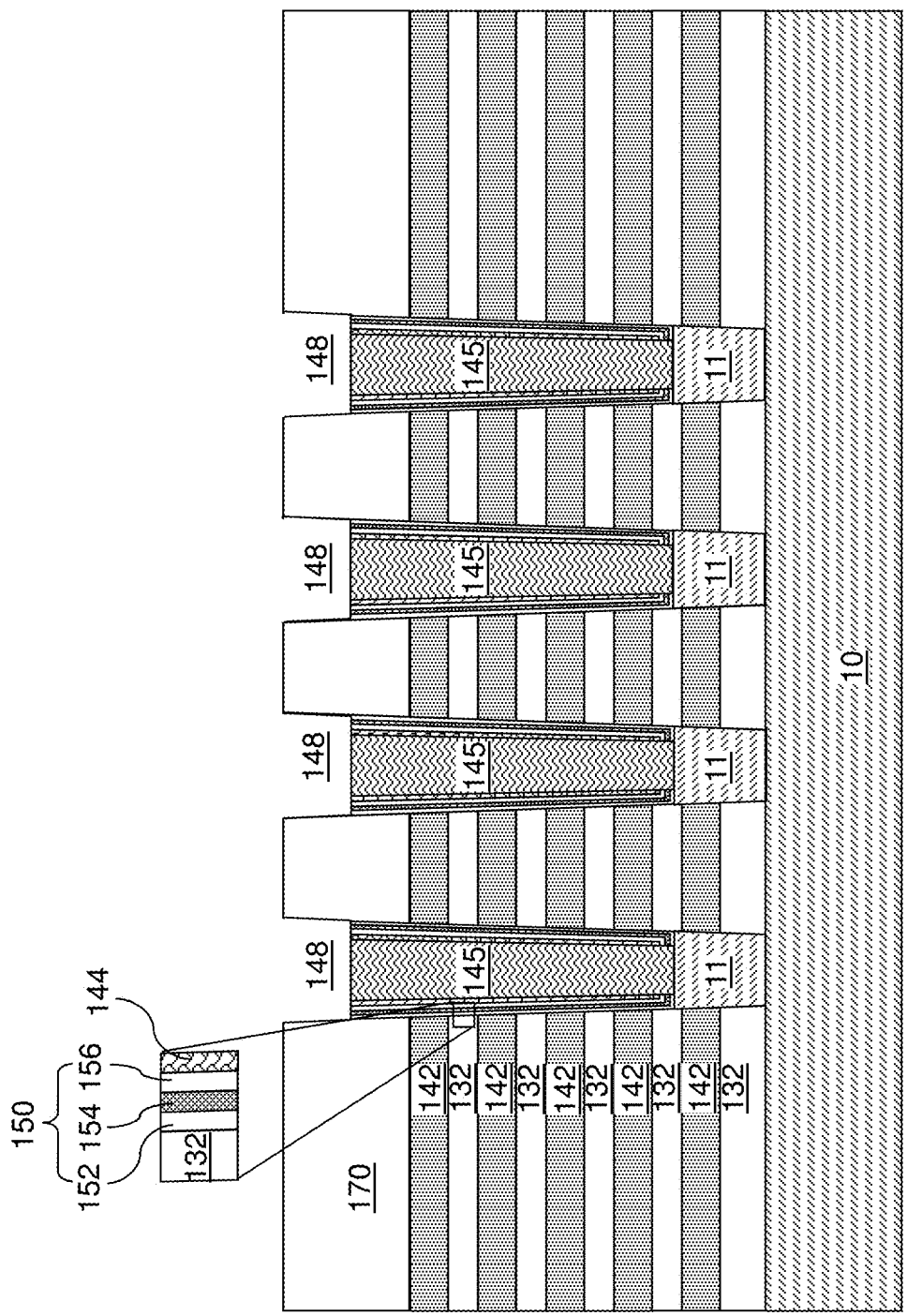
FIG. 8 is a vertical cross-sectional view of the first exemplary structure after removing physically exposed portions of the first memory films according to the first embodiment of the present disclosure.

Referring to FIG. 8, upper end portions of the first memory films 150 exposed in the cavities 148 can be removed by an isotropic etch process that sequentially etches the materials of the first tunneling dielectrics 156, the first charge storage layers 154, and the first blocking dielectrics 152. The removed upper end portions of the first memory films 150 comprise physically exposed tubular regions of the first memory films 150 located above the horizontal plane including the top surfaces of the lower sacrificial fill material portions 145. Sidewalls of the first insulating cap layer 170 can be physically exposed around recessed regions overlying the lower sacrificial fill material portions 145.

Figure 9:
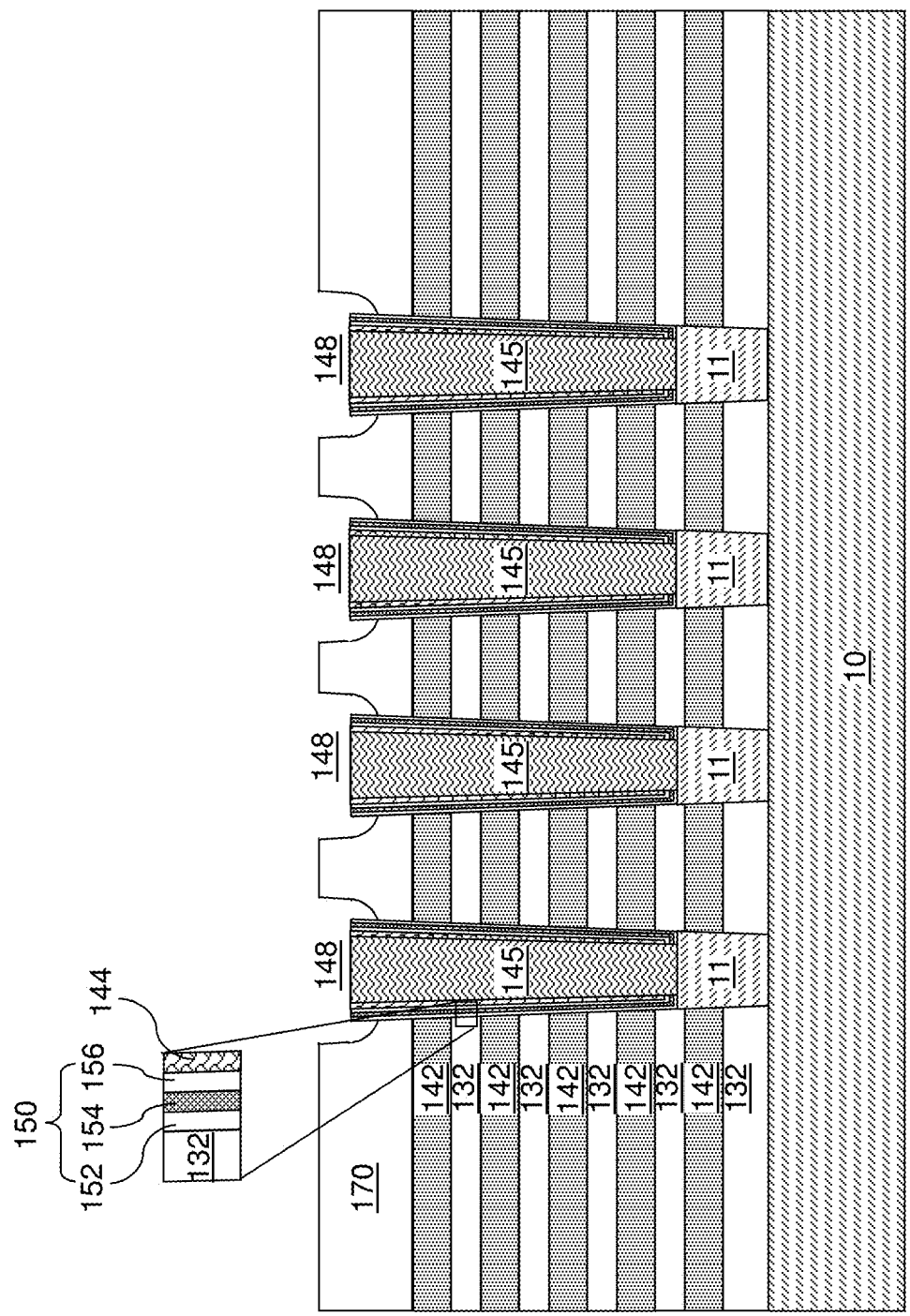
FIG. 9 is a vertical cross-sectional view of the first exemplary structure after isotropically recessing the first insulating cap layer according to the first embodiment of the present disclosure.

Referring to FIG. 9, the cavities 148 overlying the lower sacrificial fill material portions 145 are laterally expanded by isotropically recessing the first insulating cap layer 170. For example, if the first insulating cap layer 170 includes undoped silicate glass (such as densified TEOS oxide), a wet etch process employing dilute hydrofluoric acid can be employed to isotropically etch physically exposed portions of the first insulating cap layer 170 at a controlled etch rate. The lateral recess distance of the first insulating cap layer 170 can be in a range from 5 nm to 50 nm, although lesser and greater lateral recess distances can also be employed. The top surface of the first insulating cap layer 170 can be recessed by the lateral recess distance during the isotropic etch process.

Figure 10:
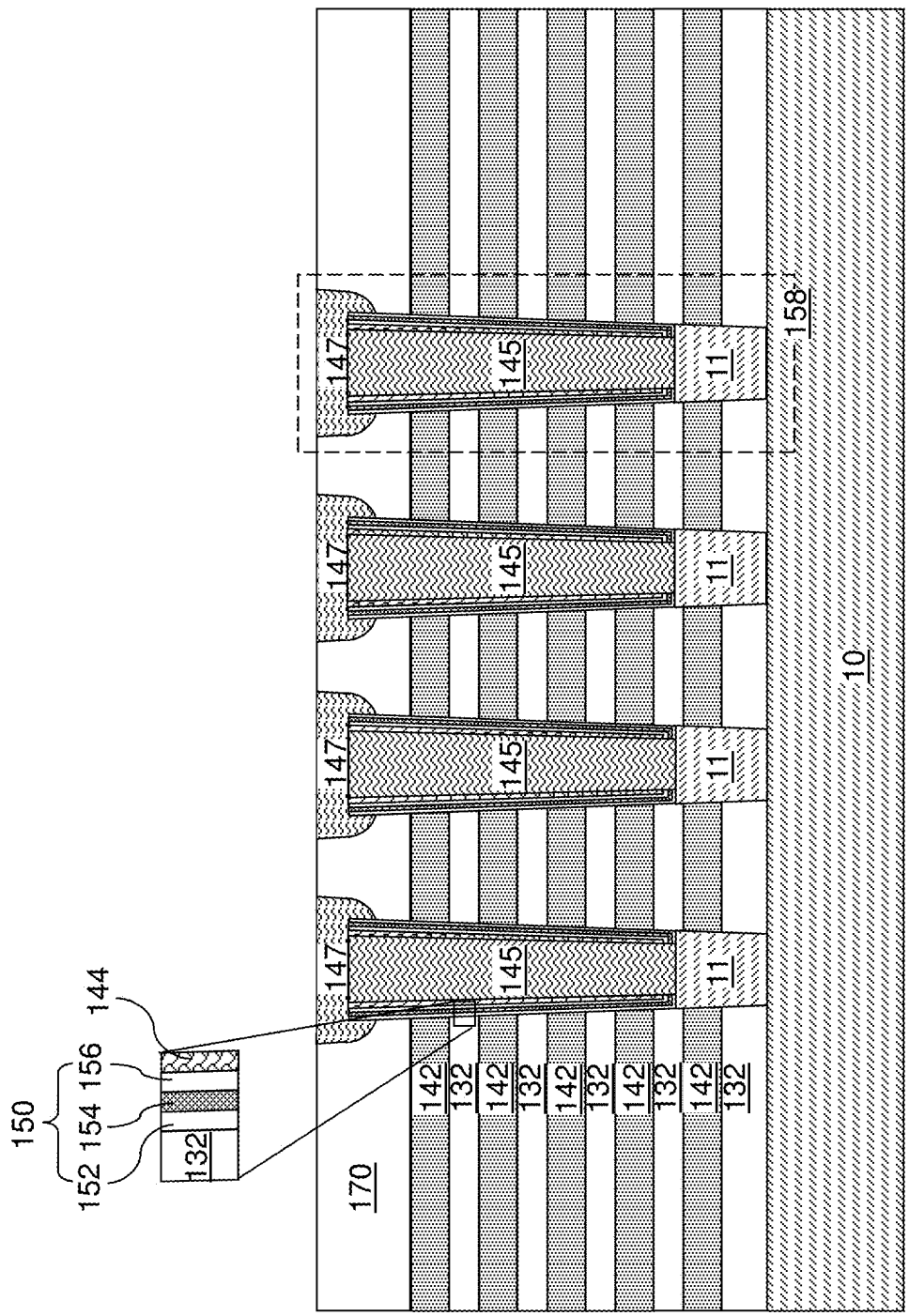
FIG. 10 is a vertical cross-sectional view of the first exemplary structure after formation of an upper sacrificial fill material portion within an upper volume of each first-tier memory opening according to the first embodiment of the present disclosure.

Referring to FIG. 10, a second sacrificial fill material can be deposited in the laterally expanded cavities 148 overlying the lower sacrificial fill material portions 145. The second sacrificial fill material can include any of the materials that may be employed as the first sacrificial fill material. The second sacrificial fill material may, or may not, be the same as the first sacrificial fill material of the lower sacrificial fill material portions 145. Excess portions of the second sacrificial fill material overlying the horizontal plane including the top surface of the first insulating cap layer 170 can be removed by a planarization process such as a recess etch, chemical mechanical planarization, or a combination thereof. Each remaining portion of the second sacrificial fill material filling a respective cavity constitutes an upper sacrificial fill material portion 147. Each upper sacrificial fill material portion 147 is formed within an upper volume of each first-tier memory opening 149.

Each vertical stack of a lower sacrificial fill material portion 145 and an upper sacrificial fill material portion 147 constitutes a sacrificial fill structure (145, 147). Each sidewall of the first insulating cap layer 170 that is contacted by a respective sacrificial fill material structure (145, 147) include a vertical sidewall segment and a concave sidewall segment that adjoins a lower end of the vertical sidewall segment. Each concave sidewall segment of the first insulating cap layer 170 can have bottom periphery that adjoins a sidewall of a respective first memory film 150. The set of all components filling a first-tier memory opening is herein referred to as a first-tier memory opening fill structure 158, which includes a pedestal channel portion 11, a first memory film 150, an optional first cover material tube 144, a lower sacrificial fill material portion 145, and an upper sacrificial fill material portion 147. Each first-tier support opening, if present, can be filled with a respective first-tier support opening fill structure (not expressly shown) having an identical set of components as the components of a first-tier memory opening fill structure 158. The components of a first-tier support opening fill structure may have different lateral dimensions than corresponding components of a first-tier memory opening fill structure 158. The set of all structures between the horizontal plane including the bottommost surface of the first alternating stack (132, 142) and the horizontal plane including the top surface of the first insulating cap layer 170 is herein referred to as a first-tier structure (132, 142, 170, 158).

Figure 11:
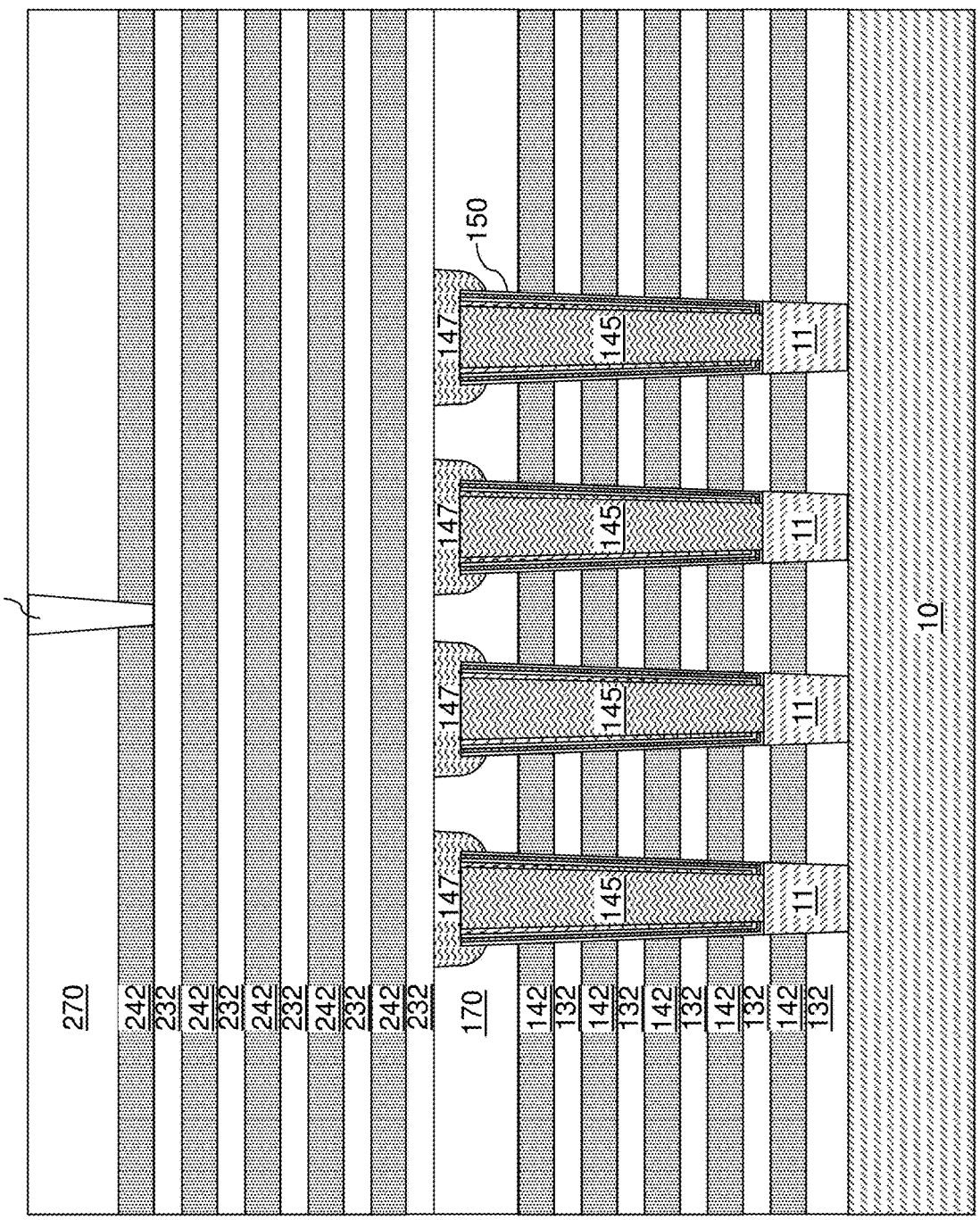
FIG. 11 is a vertical cross-sectional view of the first exemplary structure after formation of a second alternating stack of second insulating layers and second sacrificial material layers according to the first embodiment of the present disclosure.

Referring to FIG. 11, a second-tier structure can be formed over the first-tier structure (132, 142, 170, 158). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material. In one embodiment, the bottommost one of the second insulating layers 232 can be vertically spaced from the first memory films 150 upon formation of the second alternating stack (232, 242).

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A second insulating tier cap layer 270 can be subsequently formed over the second stack (232, 242). The second insulating tier cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride. Optionally, second stepped surfaces (not shown) can be region in the contact region in the same manner as formation of the first stepped surfaces. A second retro-stepped dielectric material portion (not shown) may be formed over the second stepped surfaces. Isolation trenches may be formed through the second insulating cap layer 270 and at least one underlying second sacrificial material layer 242, and can be filled within a dielectric material such as silicon oxide to form a dielectric isolation structure 72.

Figure 12A:
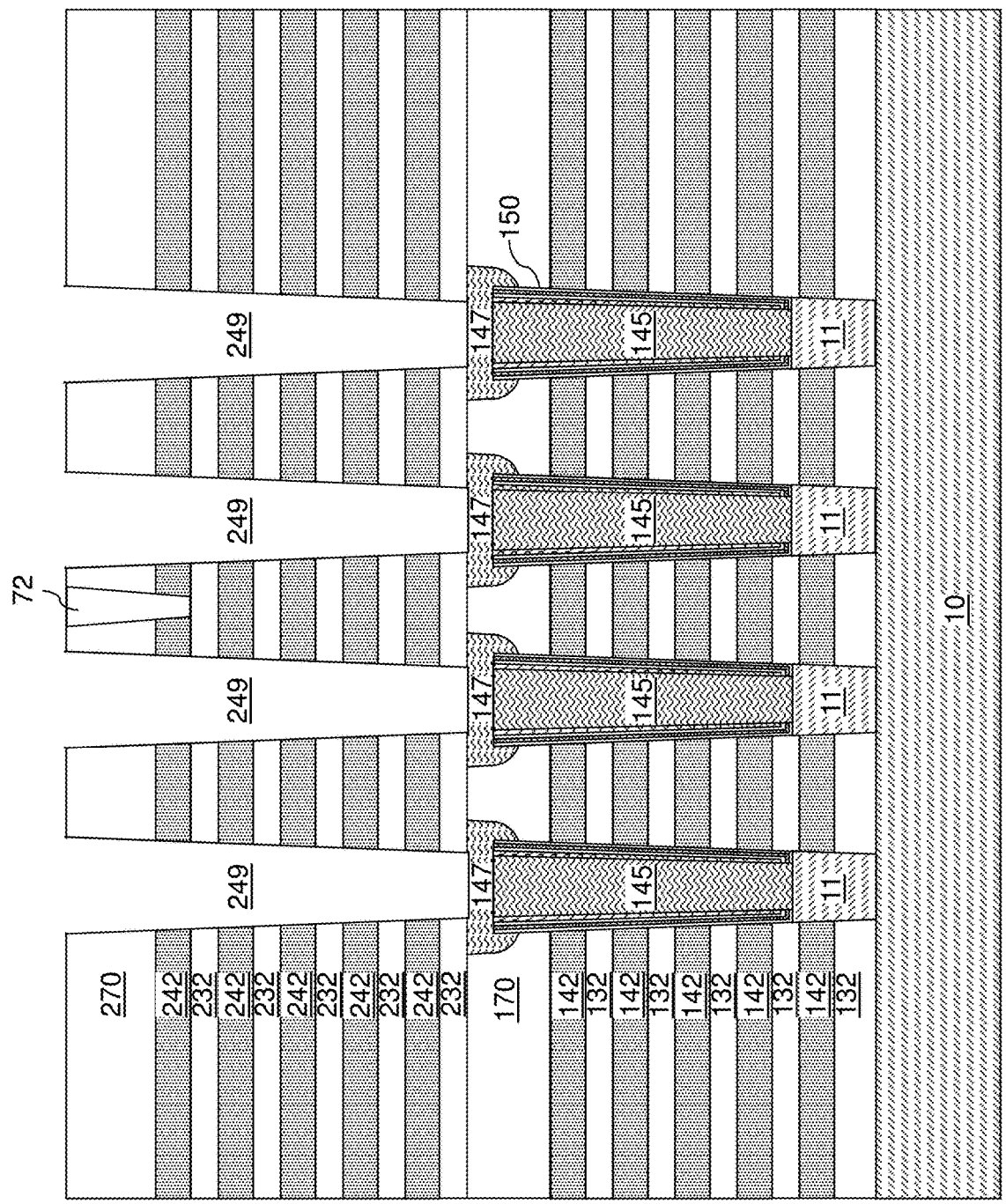
FIG. 12A is a vertical cross-sectional view of the first exemplary structure after formation of second-tier memory openings according to the first embodiment of the present disclosure.
Figure 12B:
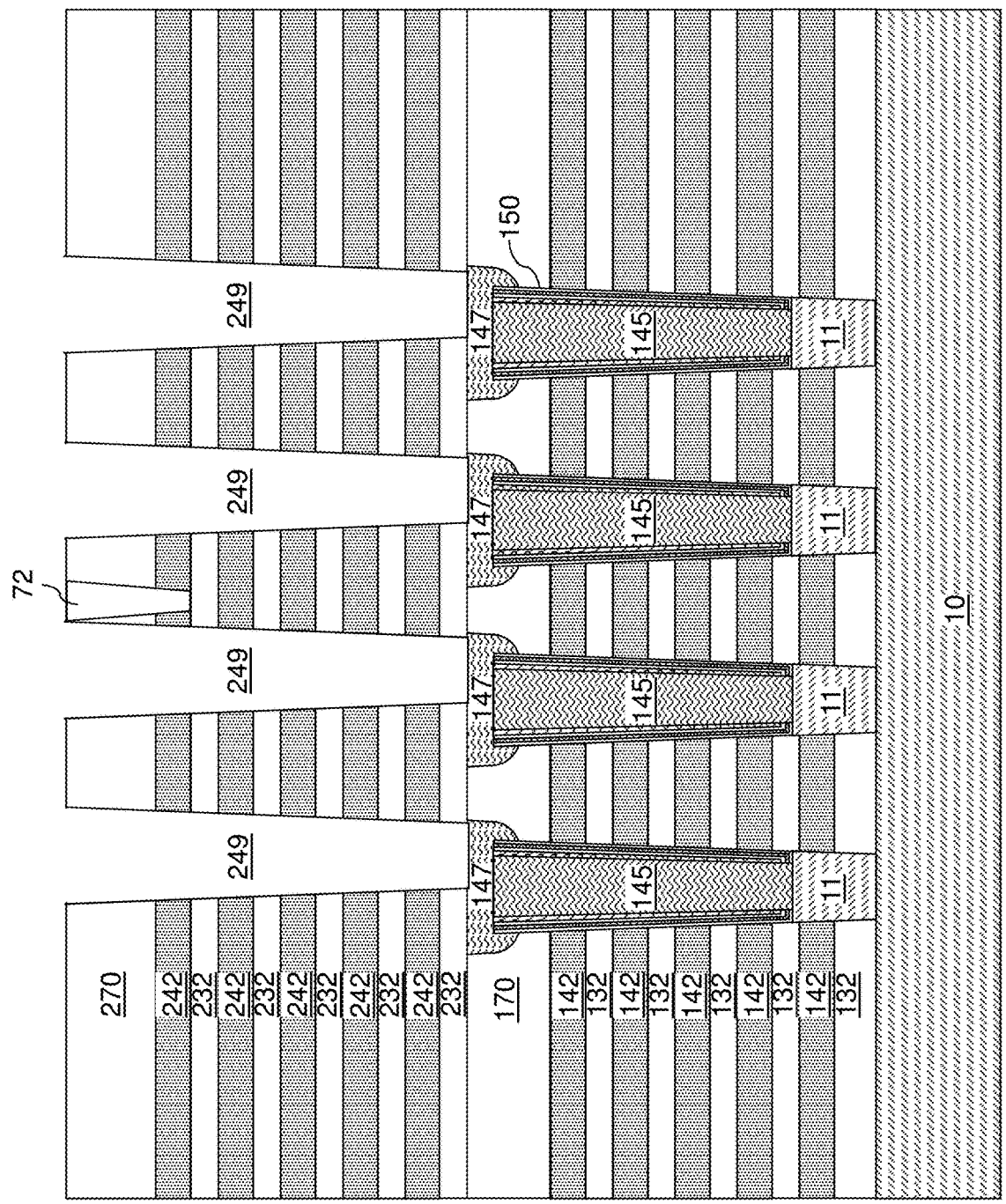
FIG. 12B is a vertical cross-sectional view of the first exemplary structure after formation of second-tier memory openings in case of misalignment between the second-tier memory openings and first-tier memory openings according to the first embodiment of the present disclosure.

Referring to FIGS. 12A and 12B, second-tier memory openings 249 can be formed through the second insulating cap layer 270 and the second alternating stack (232, 242) over, and onto, a respective one of the first sacrificial fill structures (145, 147). FIG. 12A illustrates an embodiment in which the overlay variation between the pattern of the first-tier memory openings 149 and the second-tier memory openings 249 is zero, and FIG. 12B illustrates an embodiment in which the overlay variation between the pattern of the first-tier memory openings 149 and the second-tier memory openings 249 is at a maximum value. Specifically, the second-tier memory openings 249 can be formed through the second-tier structure (232, 242, 270) in each area overlying the first-tier memory openings 149, i.e., in areas that substantially coincide with the areas of the first-tier memory openings 149. The second-tier memory openings 249 can be formed to the top surface of the sacrificial fill structures (145, 147). For example, a lithographic material stack (not shown) including at least a photoresist layer can be formed over the second insulating tier cap layer 270 and the second-tier structure (232, 242, 270), and can be lithographically patterned to form openings within the lithographic material stack. The pattern in the lithographic material stack can be transferred through the entirety of the second-tier structure (232, 242, 270) by at least one anisotropic etch that employs the patterned lithographic material stack as an etch mask. Portions of the second insulating tier cap layer 270 and the second-tier structure (232, 242, 270) underlying the openings in the patterned lithographic material stack are etched to form the second-tier memory openings 249. In other words, the transfer of the pattern in the patterned lithographic material stack through the second insulating tier cap layer 270 and the second-tier structure (232, 242, 270) forms the second-tier memory openings 249. A misalignment can occur between the second-tier memory openings 249 and the first-tier memory openings 149 due to overlay variations that are inherent in lithographic alignment of a new pattern (the pattern of the openings for the second-tier memory openings) with a pre-existing pattern (the pattern of the sacrificial fill structures (145, 147)).

In one embodiment, the chemistry of the anisotropic etch process employed to etch through the materials of the second stack (232, 242) can alternate to optimize etching of the third and fourth materials in the second stack (232, 242). The anisotropic etch can be, for example, a series of reactive ion etches. The sidewalls of the second-tier memory openings 249 can be substantially vertical, or can be tapered. In one embodiment, the sacrificial fill structures (145, 147) may be employed as stopping structures for the anisotropic etch process that forms the second-tier memory openings 249. An overetch into upper portions of the sacrificial fill structures (145, 147) can occur during the anisotropic etch.

Figure 13:
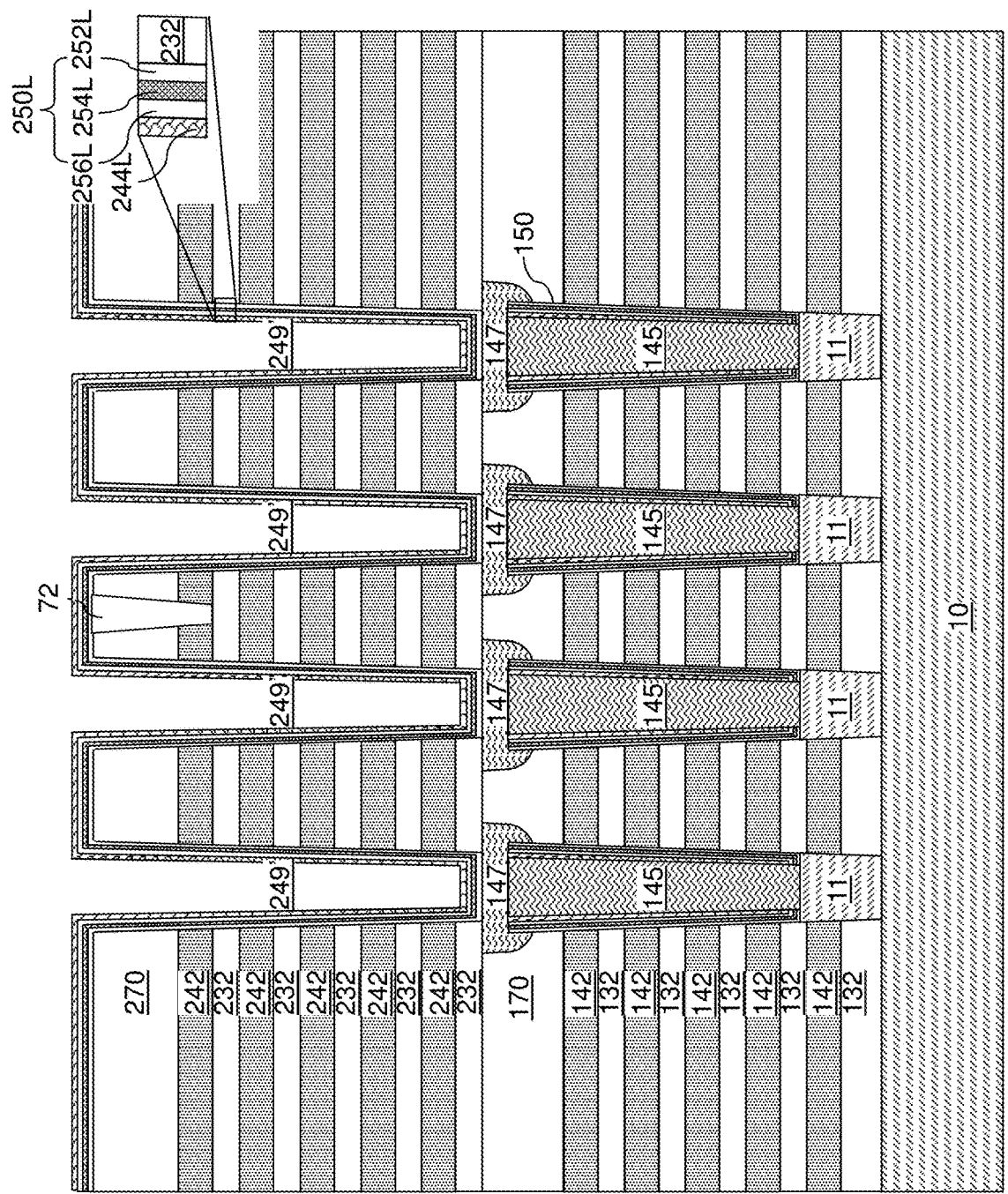
FIG. 13 is a vertical cross-sectional view of the first exemplary structure after formation of a second memory film layer and a second cover material layer according to the first embodiment of the present disclosure.

Referring to FIG. 13, a second memory film layer 250L can be deposited conformally in remaining volumes of the second-tier memory openings 249 and over the second insulating cap layer 270. If second-tier support openings are present in the contact region, the second memory film layer 250L can be deposited in the second-tier support openings. The second memory film layer 250L including a second blocking dielectric layer 252L, a second continuous charge storage layer 254L, and a second tunneling dielectric layer 256L.

The second blocking dielectric layer 252L can include a single dielectric material layer or a stack of a plurality of dielectric material layers. In one embodiment, the second blocking dielectric layer 252L can include a dielectric metal oxide layer consisting essentially of a dielectric metal oxide. The second blocking dielectric layer 252L can include any material that may be employed for the first blocking dielectric layer 152L. The second blocking dielectric layer 252L can have a thickness in a range from 3 nm to 20 nm, although lesser and greater thicknesses can also be employed.

The second continuous charge storage layer 254L can be subsequently formed. In one embodiment, the second continuous charge storage layer 254L can be a continuous layer of a charge trapping material including a dielectric charge trapping material, which can be, for example, silicon nitride. The second continuous charge storage layer 254L may have the same composition as, or a different composition from, the first continuous charge storage layer 154L. The second continuous charge storage layer 254L can be formed, for example, by chemical vapor deposition (CVD), atomic layer deposition (ALD), physical vapor deposition (PVD), or any suitable deposition technique for storing electrical charges therein. The thickness of the second continuous charge storage layer 254L can be in a range from 2 nm to 20 nm, although lesser and greater thicknesses can also be employed.

The second tunneling dielectric layer 256L includes a dielectric material through which charge tunneling can be performed under suitable electrical bias conditions. The second tunneling dielectric layer 256L can include any material that may be employed for the first tunneling dielectric layer 156L. The second tunneling dielectric layer 256L may have the same composition as, or may have a different composition from, the first tunneling dielectric layer 156L. The thickness of the second tunneling dielectric layer 256L can be in a range from 2 nm to 20 nm, although lesser and greater thicknesses can also be employed.

A second cover material layer 244L can be subsequently deposited by a conformal deposition process over the second memory film layer 250L. The second cover material layer 244L can include amorphous semiconductor material (such as amorphous silicon) or a carbon-based material (such as amorphous carbon or diamond-like carbon (DLC)). The thickness of the second cover material layer 244L can be in a range from 2 nm to 20 nm, although lesser and greater thicknesses can also be employed. A second memory cavity 249' can be present within each unfilled volume of the second-tier memory opening 249.

Figure 14:
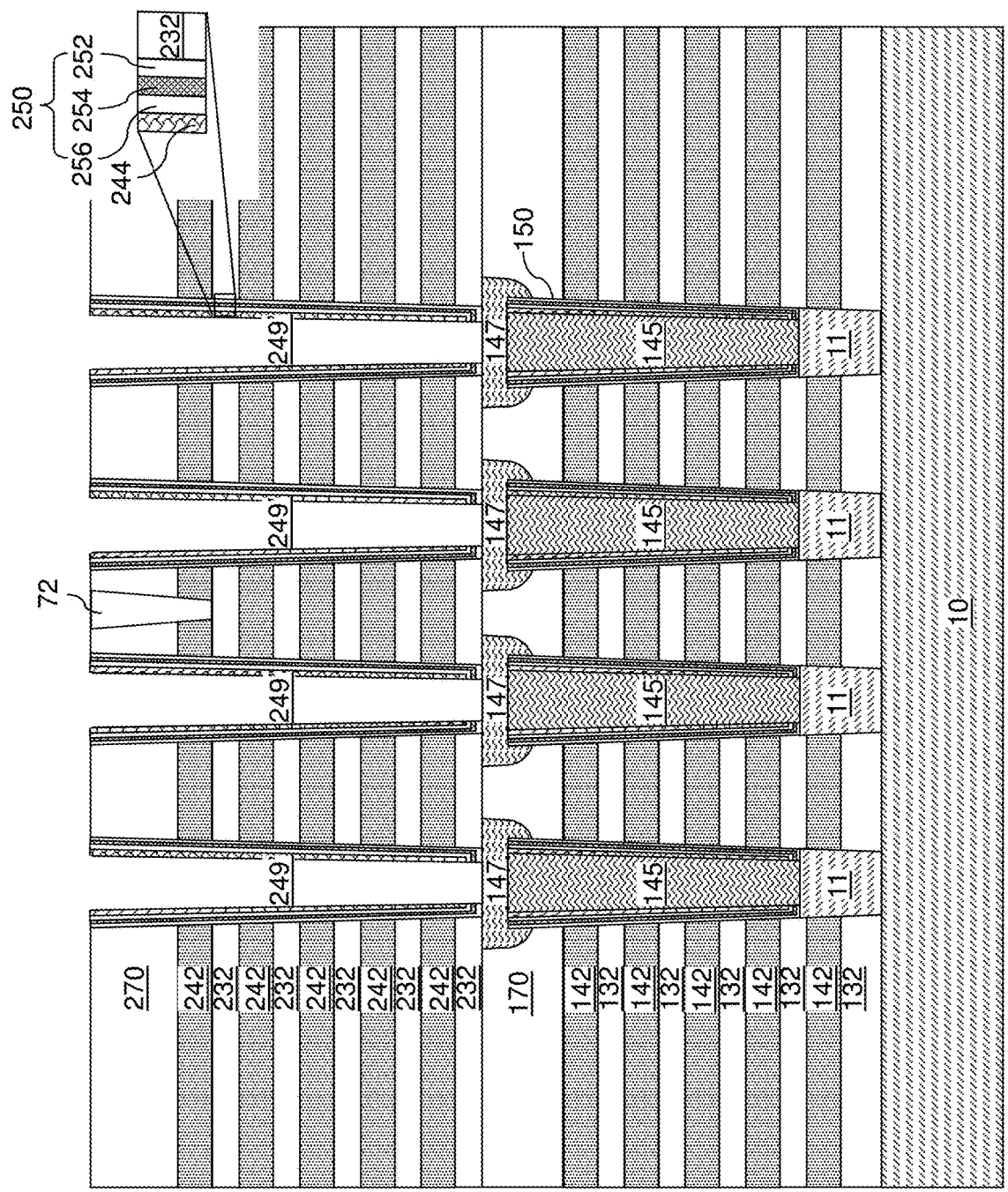
FIG. 14 is a vertical cross-sectional view of the first exemplary structure after anisotropically etching the second cover material layer and the second memory film layer according to the first embodiment of the present disclosure.

Referring to FIG. 14, horizontal portions of the second cover material layer 244L and the second memory film layer 250L are removed by an anisotropic etch process. Each remaining portion of the second memory film layer 250L within the second-tier memory openings 249 constitutes a second memory film 250. Each second memory film 250 can have a respective tubular shape in which the sidewalls have a zero, or non-zero, taper angle with respect to a vertical direction (which may be less than 10 degrees). Each second memory film 250 can include a nested stack of a second blocking dielectric 252, a second charge storage layer 254, and a second tunneling dielectric 256. Thus, each second memory film 250 comprises, from outside to inside, a second blocking dielectric 252, a second charge storage layer 254, and a second tunneling dielectric 256. Each second blocking dielectric 252 can be a remaining tubular portion of the second blocking dielectric layer 252L, each second charge storage layer 254 can be a remaining tubular portion of the second continuous charge storage layer 254L, and each second tunneling dielectric 256 can be a remaining tubular portion of the second tunneling dielectric layer 256L. Remaining cylindrical portions of the second cover material layer 244L constitute second cover material tubes 244, each of which can have a respective tubular shape and protect a respective memory film 250 during the anisotropic etch process. During the above etch step, the first memory film 150 is not damaged because it is protected by the sacrificial fill structure (145, 147).

Each first memory film 150 is formed at a periphery of a respective first-tier memory opening 149. Each second memory film 250 is formed at a periphery of a respective second-tier memory opening 249. Each second memory film 250 can be vertically spaced from an underlying first memory film 150 and does not directly contact the first memory film 150. In this case, each second tunneling dielectric 256 is not in direct contact with any first tunneling dielectric 156, each second charge storage layer 254 is not in direct contact with any first charge storage layer 154 and each second blocking dielectric 252 is not in direct contact with any first blocking dielectric 152.

Figure 15:
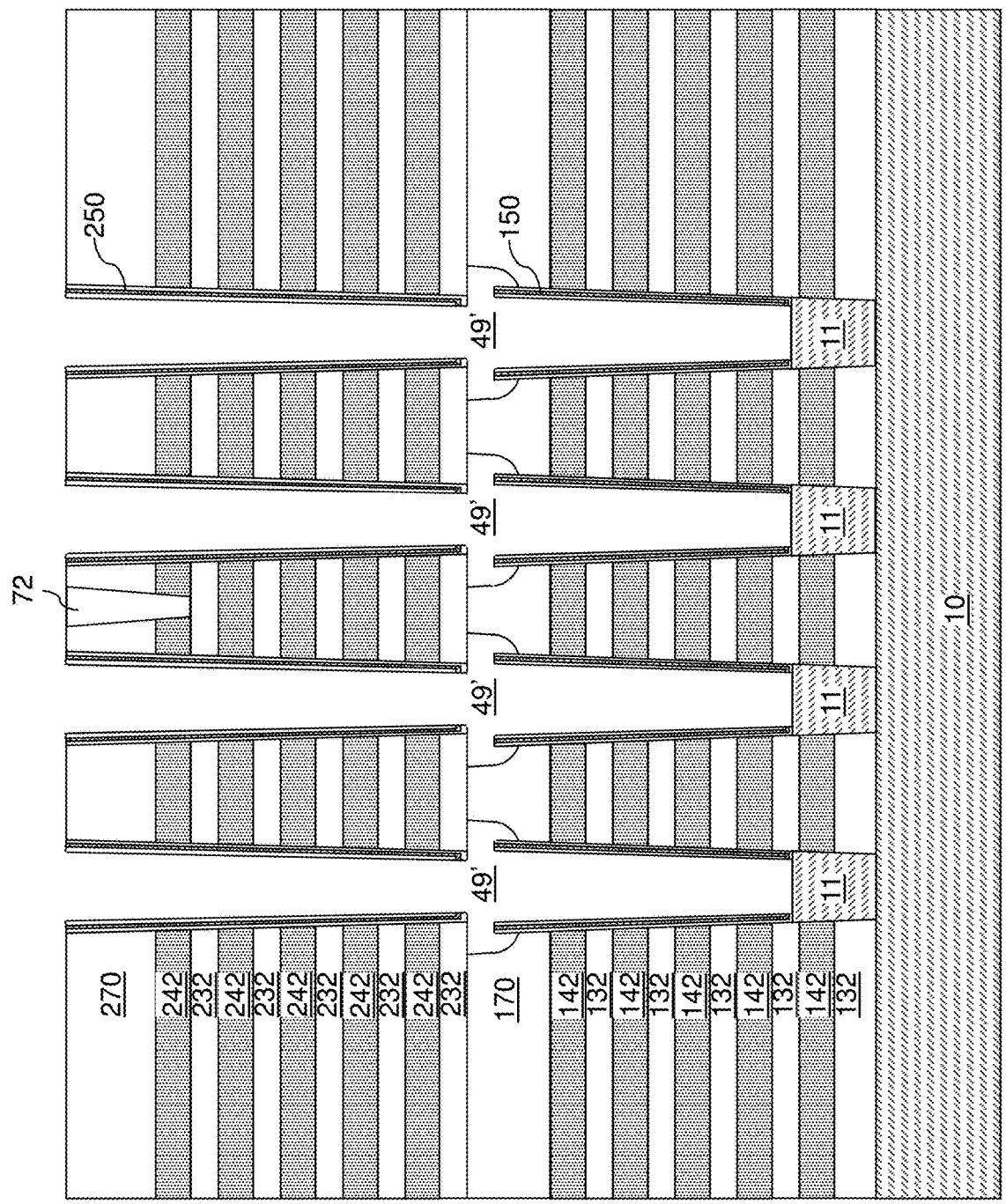
FIG. 15 is a vertical cross-sectional view of the first exemplary structure after removal of sacrificial fill structures and formation of memory cavities according to the first embodiment of the present disclosure.

Referring to FIG. 15, the sacrificial fill structures (145, 147) can be removed from underneath each second-tier memory opening 249. For example, a selective etch process that etches the sacrificial fill structures (145, 147), selective to the second cover material tubes 244 (if present), the first cover material tubes 144 (if present) the first memory film 150, the second memory film 250, and the pedestal channel portions 11 can be performed. For example, if the sacrificial fill structures (145, 147) includes a silicon-germanium alloy, a SC-1 wet etch solution including ammonia water and hydrogen peroxide can be employed to etch the sacrificial fill structures (145, 147) selective to the second cover material tubes 244, the first cover material tubes 144 and the pedestal channel portions 11, which all comprise silicon. In another embodiment, if the second cover material tubes 244 and the first cover material tubes 144 are omitted, then the SC-1 wet etch solution can be employed to etch the sacrificial fill structures (145, 147) selective to the first memory film 150, the second memory film 250, and the pedestal channel portions 11. If the sacrificial fill structures (145, 147) includes borosilicate glass or organosilicate glass, a wet etch solution including dilute hydrofluoric acid can be employed to etch the sacrificial fill structures (145, 147) selective to the to the second cover material tubes 244, the first cover material tubes 144 and the pedestal channel portions 11.

In case the second cover material tubes 244 and the first cover material tubes 144 include amorphous silicon or polysilicon, a wet etch process employing trimethylammonium hydroxide (TMAH) may be employed to remove the second cover material tubes 244 and the first cover material tubes 144 selective to the first memory films 150, the second memory films 250. In case the second cover material tubes 244 and the first cover material tubes 144 include a carbon-based material, an ashing process may be employed to remove the second cover material tubes 244 and the first cover material tubes 144 selective to the first memory films 150, the second memory films 250 and the pedestal channel portions 11. A memory opening is formed through the first-tier structure and the second-tier structure. Each memory opening includes a continuous volume in which the materials of the first alternating stack (132, 142), the first insulating cap layer 170, the second alternating stack (232, 242), and the second insulating cap layer 270 is removed. Each memory opening (149, 249) includes a stack of a first memory opening 149 and a second memory opening 249. Each continuous cavity including a void within a second-tier memory opening 249 and additional voids formed by removal of an underlying sacrificial fill structure (145, 147), a second cover material tube 244, and a first cover material tube 144 constitutes a memory cavity 49', which is an unfilled volume within a respective memory opening.

Figure 16:
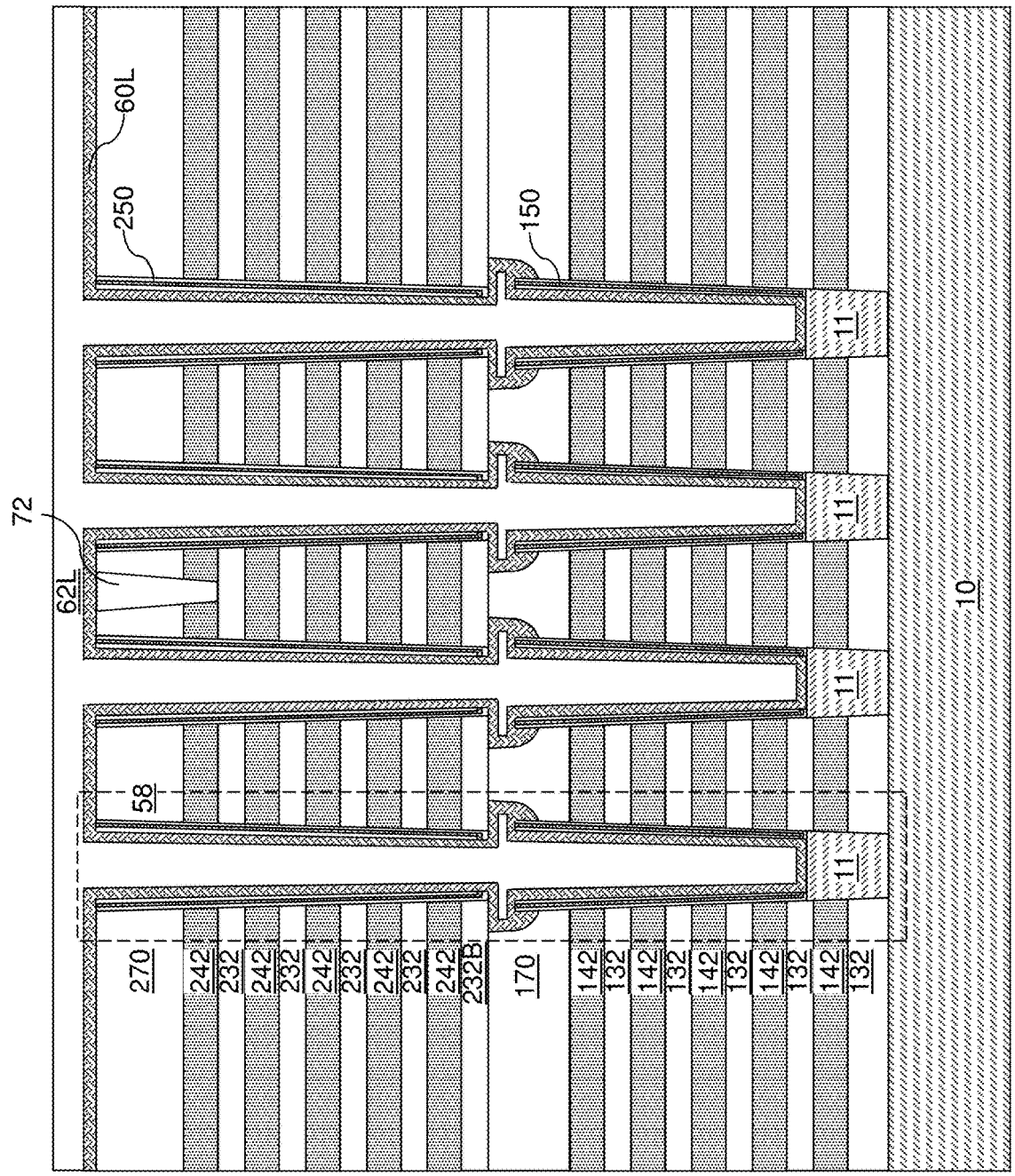
FIG. 16 is a vertical cross-sectional view of the first exemplary structure after deposition of a semiconductor channel layer and a dielectric core material layer according to the first embodiment of the present disclosure.

Referring to FIG. 16, a semiconductor channel layer 60L can be deposited on the physically exposed surfaces within the memory cavities 49' and over the second insulating cap layer 270 by a conformal deposition process. Specifically, the semiconductor channel layer 60L can be deposited on the top surface of the pedestal channel portions 11 inner sidewalls, annular top surfaces, and upper end portions of outer sidewalls of the first memory films 150, physically exposed sidewalls of the first insulating cap layer 170, physically exposed bottom surfaces (which may be annular surfaces) of the bottommost second insulating layer 232B of the second insulating layers 232, and the inner sidewalls of the second memory films 250. Thus, the semiconductor channel layer 60 contacts the inner sidewall of each first tunneling dielectric 156, topmost surfaces of each of the first tunneling dielectrics 156, the first charge storage layers 154, the first blocking dielectrics 152, upper end portions of the outer sidewall of each first blocking dielectric 152, concave segments and vertical segments of sidewalls of the first insulating cap layer 170 around each memory opening, annular bottom surface of the second blocking dielectrics 252, and inner sidewalls of the second tunneling dielectrics 256. The semiconductor channel layer 60L is formed on top surface of the pedestal channel portions 11 (or of the substrate semiconductor layer 10 in case the pedestal channel portions 11 are not present).

The semiconductor channel layer 60L includes a semiconductor material, which can be any semiconductor material, such as silicon. The semiconductor channel layer 60L can have a doping of a first conductivity type (which can be the same conductivity type as the substrate semiconductor layer 10), or can be substantially intrinsic, i.e., having a dopant concentration that does not exceed $1.0 \times 10^{17}/cm^3$. In one embodiment, the semiconductor channel layer 60L can include amorphous silicon or polysilicon. The thickness of the semiconductor channel layer 60L can be in a range from 2 nm to 10 nm, although lesser and greater thicknesses can also be employed.

A dielectric material can be deposited in cavities surrounded by the semiconductor channel layer 60L to form a dielectric core layer 62L. The dielectric material of the dielectric core layer 62L can include undoped silicate glass or a doped silicate glass. A reflow process may be optionally performed.

Figure 17:
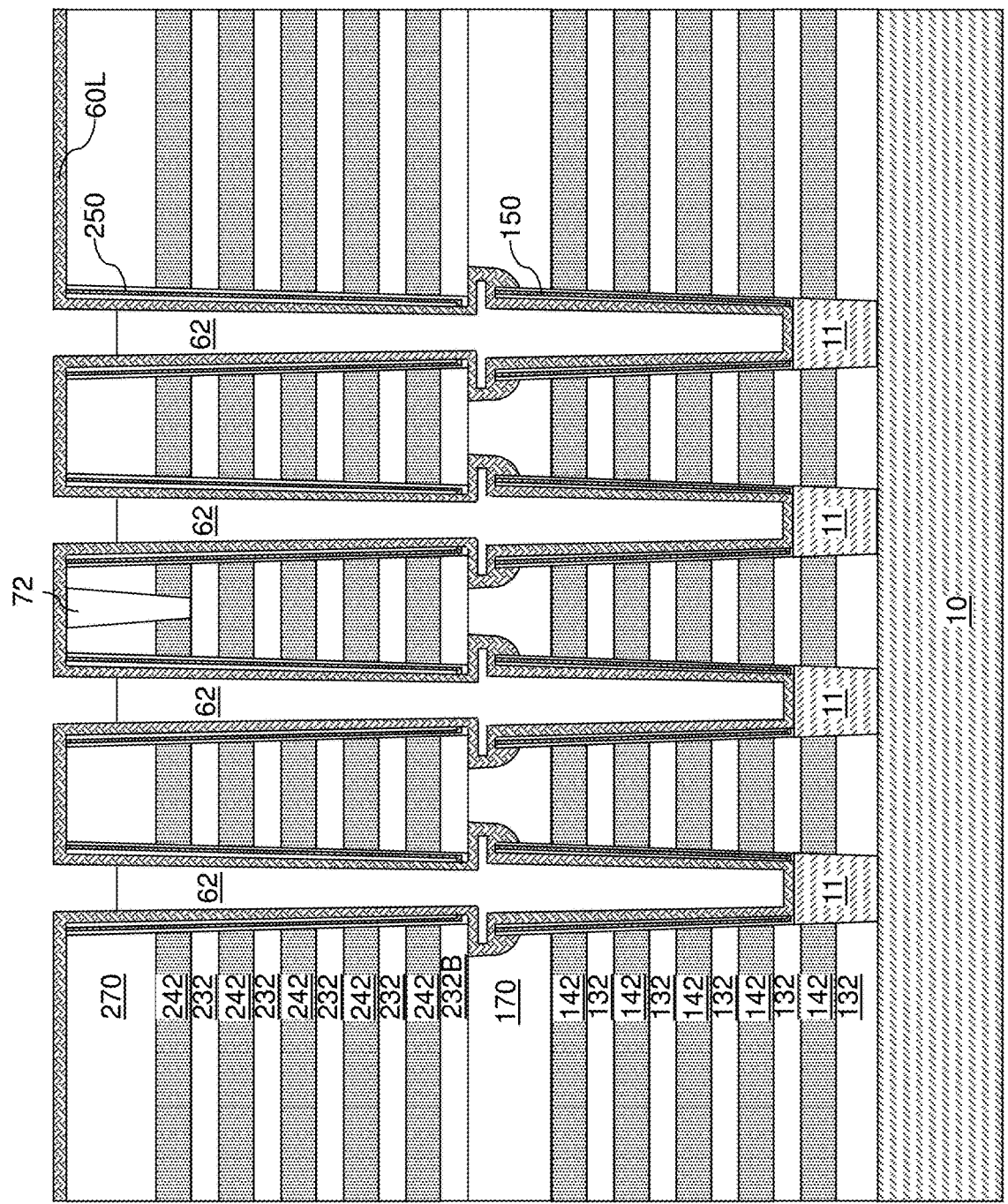
FIG. 17 is a vertical cross-sectional view of the first exemplary structure after formation of dielectric cores according to the first embodiment of the present disclosure.

Referring to FIG. 17, the dielectric material of the dielectric core layer 62L can be recessed, for example, by an isotropic etch process, such that the dielectric core layer 62L is divided into multiple discrete portions located within a respective one of the memory cavities 49' in the memory openings (149, 249). For example, a wet etch process employing dilute hydrofluoric acid can be performed to vertically recess the dielectric material of the dielectric core layer 62L. Each remaining portion of the dielectric core layer 62L constitutes a dielectric core 62. Each dielectric core 62 can have a top surface between a first horizontal plane including the top surface of the second insulating cap layer 270 and a second horizontal plane including the bottom surface of the second insulating cap layer 270.

Figure 18A:
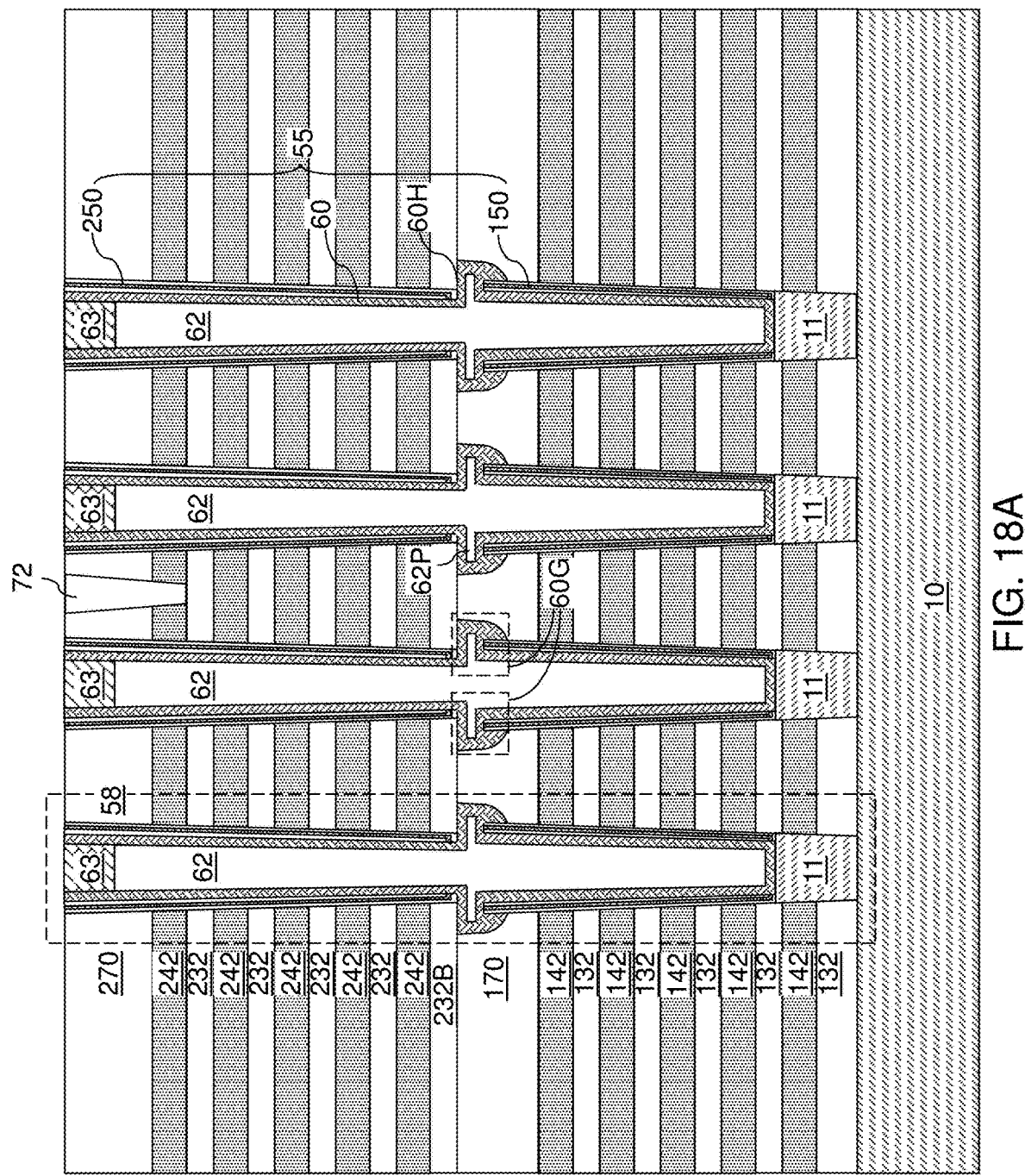
FIG. 18A is a vertical cross-sectional view of the first exemplary structure after formation of memory stack structures and drain regions according to the first embodiment of the present disclosure.
Figure 18B:
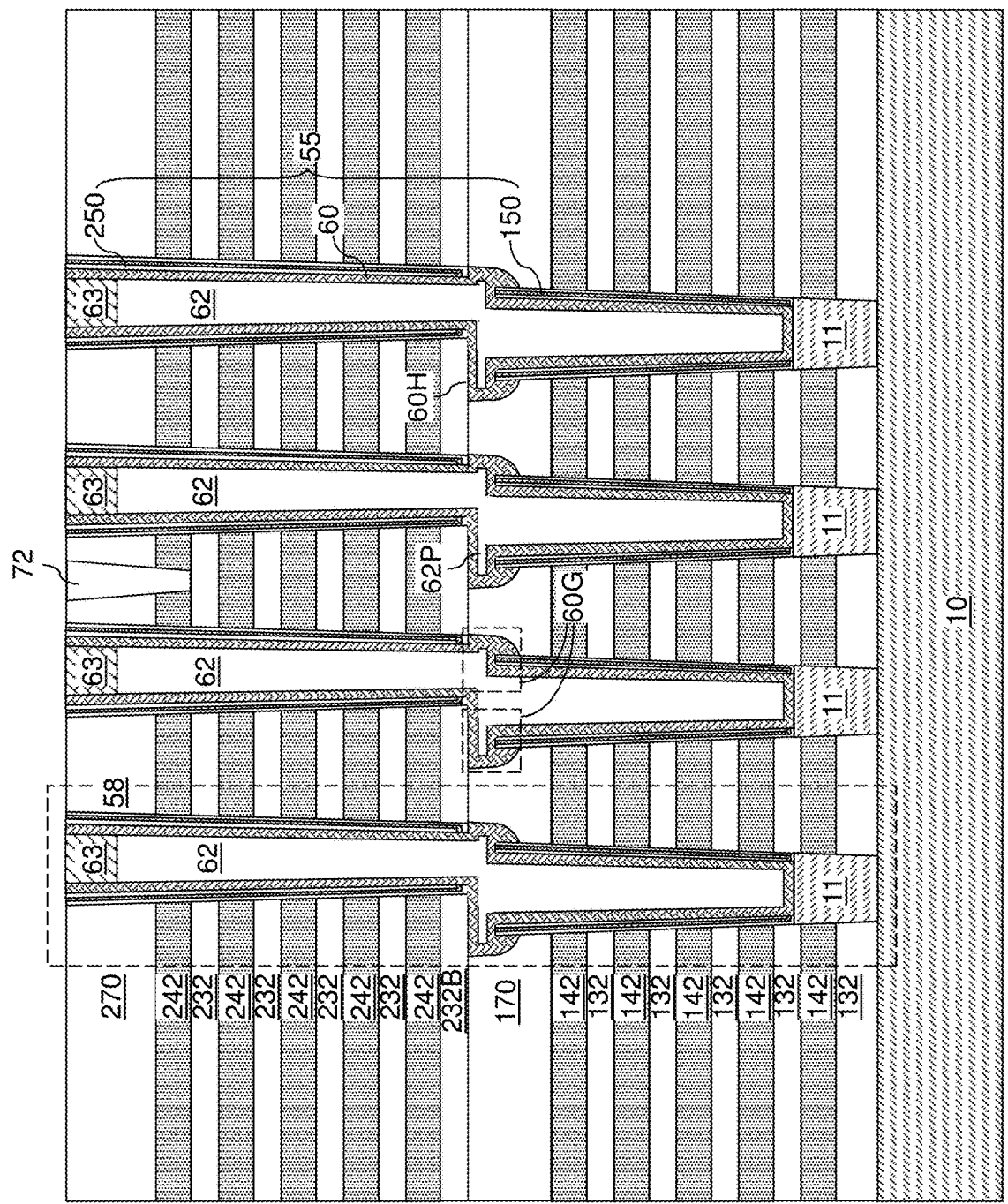
FIG. 18B is a vertical cross-sectional view of the first exemplary structure after formation of memory stack structures and drain regions in case of misalignment between second-tier memory openings and first-tier memory openings according to the first embodiment of the present disclosure.

Referring to FIGS. 18A and 18B, drain regions 63 can be formed in recess regions overlying the dielectric cores 62. FIG. 18A illustrates an embodiment in which the overlay variation between the pattern of the first-tier memory openings 149 and the second-tier memory openings 249 is zero, and FIG. 18B illustrates an embodiment in which the overlay variation between the pattern of the first-tier memory openings 149 and the second-tier memory openings 249 is at a maximum value.

Specifically, a doped semiconductor material having doping of a second conductivity type that is the opposite type of the first conductivity type can be deposited in the recess regions overlying the dielectric cores 62. The doped semiconductor material can be, for example, doped polysilicon. The atomic concentration of the dopants of the second conductivity type can be in a range from $5.0 \times 10^{19}/cm^3$ to $2.0 \times 10^{21}/cm^3$, although lesser and greater atomic concentrations can also be employed. Excess portions of the deposited doped semiconductor material can be removed from above the first horizontal plane including the top surface of the second insulating cap layer 270 by a planarization process, which can employ, for example, chemical mechanical planarization (CMP) and/or a recess etch. Portions of the semiconductor channel layer 60L overlying the first horizontal plane can be removed from above the first horizontal plane during the planarization process. Each remaining portion of the semiconductor channel layer 60L constitutes a semiconductor channel 60. Each remaining portion of the doped semiconductor material having a doping of the second conductivity type constitutes a drain region 63.

A memory opening fill structure 58 is formed in the memory cavity 49' and around each memory opening (149, 249). Each memory opening fill structure 58 can include an optional pedestal channel portion 11, a first memory film 150, a second memory film 250, a semiconductor channel 60, an optional dielectric core 62 (in case the semiconductor channel layer does not completely fill the memory openings upon deposition), and a drain region 63. Each contiguous combination of a semiconductor channel 60, a first memory film 150, and a second memory film 250 constitutes a memory stack structure 55, which contains a plurality of vertically stacked charge storage elements comprising portions of the first and second charge storage layers (154, 254) located at the levels of the first and second sacrificial material layers (142, 242).

Within each memory opening fill structure 58, the semiconductor channel 60 is formed directly on the first memory film 150 and the second memory film 250. The semiconductor channel 60 directly contacts a sidewall of the first insulating cap layer 170. The semiconductor channel 60 includes a horizontal surface 60H that contacts the bottommost second insulating layer 232B. The horizontal surface 60H can be coplanar with the top surface of the first insulating cap layer 170. The horizontal surface 60H at which the semiconductor channel 60 contacts the bottommost second insulating layer 232B can have an annular configuration with an inner periphery that may be concentric with the outer periphery of the horizontal surface, or off-centered with respective to the outer periphery of the horizontal surface.

In one embodiment, the outer periphery of the horizontal surface 60H of the semiconductor channel 60 can be located outside of, and does not contact, an outer bottom periphery of the second memory film 250. In one embodiment, the semiconductor channel 60 can include a first vertically-extending portion located within the first alternating stack (132, 142), a second vertically-extending portion located within the second alternating stack (232, 242), and a ledge portion 60G connecting the first vertically-extending portion and the second vertically-extending portion and located within the first insulating cap layer 170 and including the horizontal surface 60H of the semiconductor channel 60 that contacts the bottommost second insulating layers 232B within the second alternating stack (232, 242).

In one embodiment, the ledge portion 60G can have a cylindrical sidewall of the semiconductor channel 60 that contacts a sidewall of the first insulating cap layer 170. In one embodiment, the ledge portion 60G can include a convex surface that adjoins a bottom end of the cylindrical sidewall and having a periphery that adjoins an outer sidewall of the first memory film 150, and a cylindrical contact surface that adjoins the convex surface and contacting the outer sidewall of the first memory film 150, which is an upper end portion of the outer sidewall of the first blocking dielectric 152.

A dielectric core 62 can be located within the semiconductor channel 60. The dielectric core 62 can include a laterally protruding portion 62P embedded within the first insulating cap layer 170 and having a top surface that contacts a first region of the ledge portion 60G of the semiconductor channel 60 and having a bottom surface that contacts a second region of the ledge portion 60G of the semiconductor channel.

Figure 19:
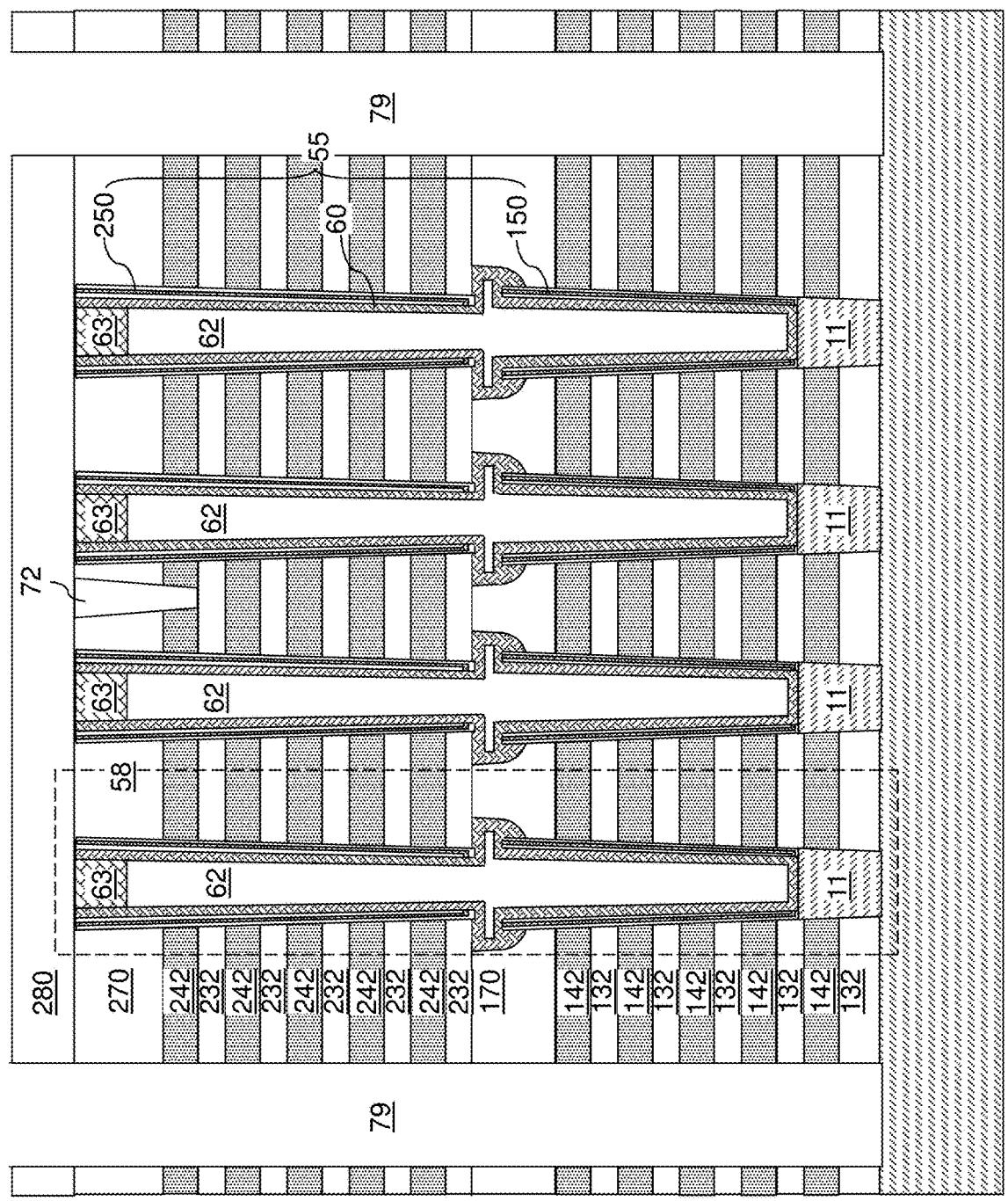
FIG. 19 is a vertical cross-sectional view of the first exemplary structure after formation of backside trenches according to the first embodiment of the present disclosure.

Referring to FIG. 19, a contact level dielectric layer 280 can be formed over the second insulating tier cap layer 270. The contact level dielectric layer 280 may be selected as an in-process structure that is consumed during subsequent planarization processes. In one embodiment, the contact level dielectric layer 280 can include a silicon oxide material deposited by chemical vapor deposition such as tetraethylorthosilicate (TEOS) silicon oxide. The thickness of the contact level dielectric layer 280 can be in a range from 50 nm to 300 nm, although lesser and greater thicknesses can also be employed.

At least one backside trench 79 can be formed through the contact level dielectric layer 280 and the upper and first-tier structures, for example, by applying a photoresist layer (not shown), lithographically patterning the photoresist layer, and transferring the pattern in the photoresist layer through the upper and first-tier structures employing an anisotropic etch. The anisotropic etch that forms the at least one backside trench 79 can stop on the substrate 10. The photoresist layer can be subsequently removed, for example, by ashing.

Figure 20:
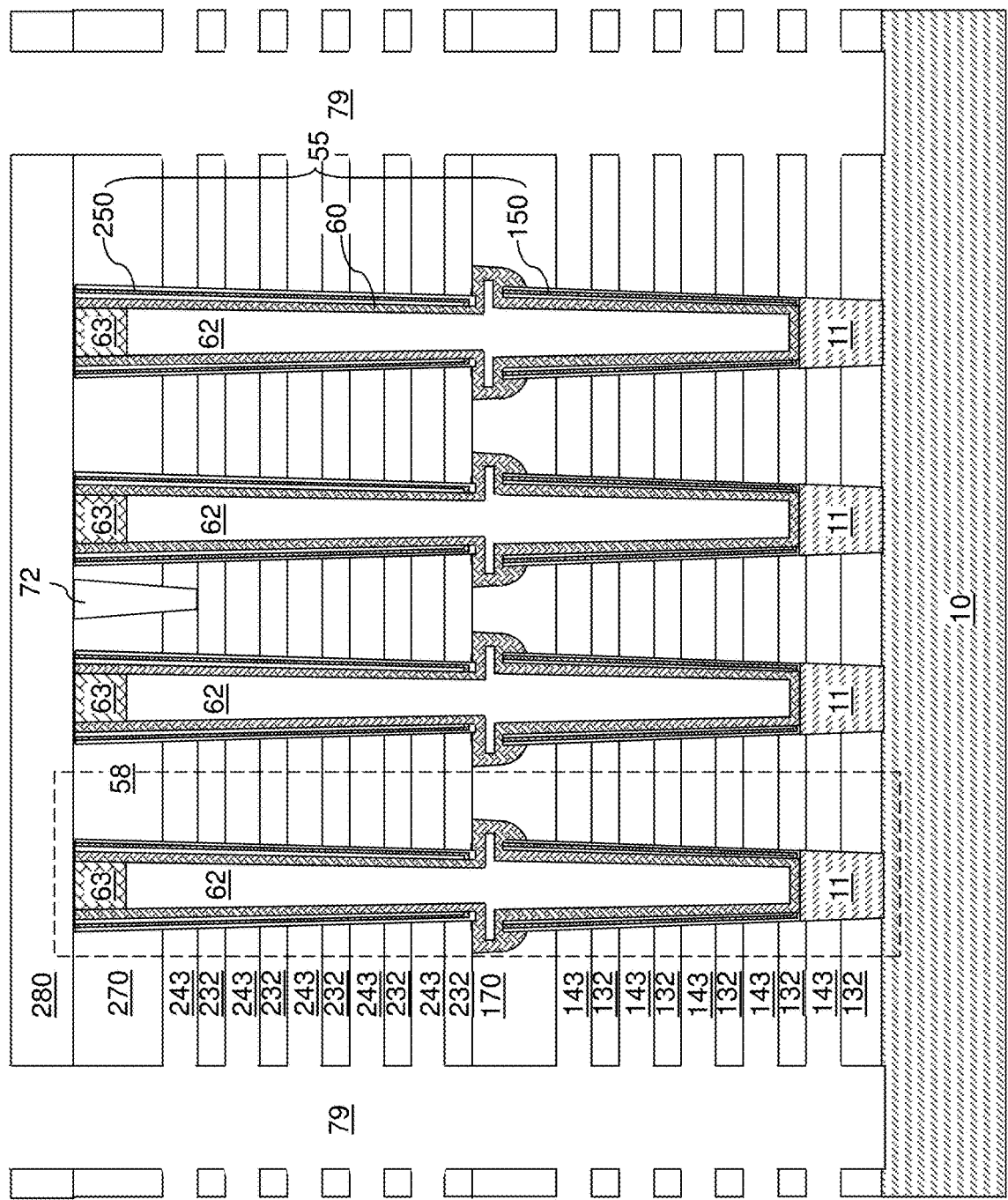
FIG. 20 is a vertical cross-sectional view of the first exemplary structure after formation of backside recesses by removal of the sacrificial material layers according to the first embodiment of the present disclosure.

Referring to FIG. 20, an etchant that selectively etches the materials of the first and second sacrificial material layers (142, 242) with respect to the materials of the first and second insulating layers (132, 232), the material of the outermost layers of the memory stack structures 55, and the first and second insulating cap layers (170, 270) can be introduced into the backside trench 79, for example, employing an isotropic etch process. First backside recesses 143 are formed in volumes from which the first sacrificial material layers 142 are removed. Second backside recesses 243 are formed in volumes from which the second sacrificial material layers 242 are removed. In one embodiment, the first and second sacrificial material layers (142, 242) can include silicon nitride, and the materials of the first and second insulating layers (132, 232), can be silicon oxide.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 10. A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

Figure 21:
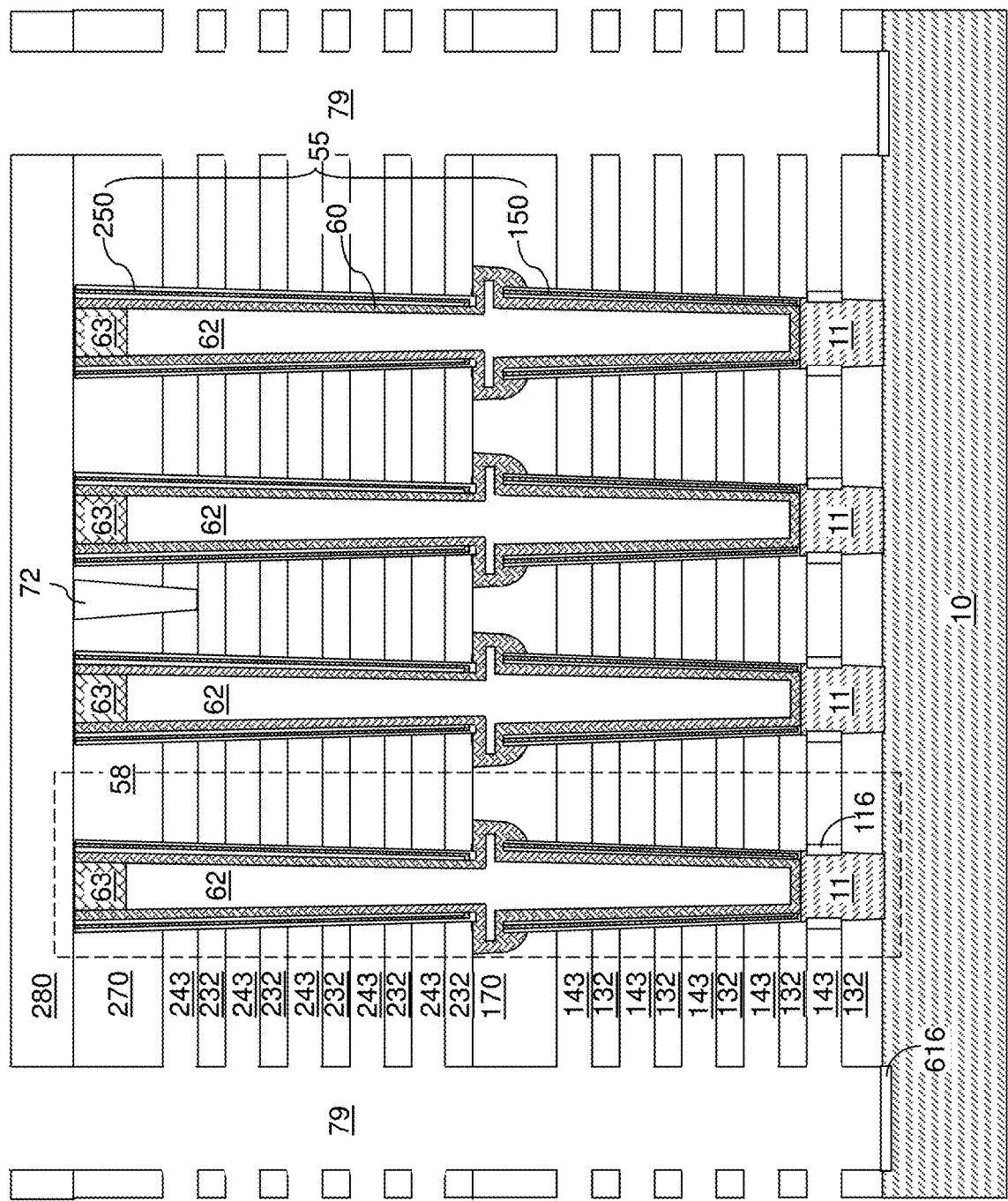
FIG. 21 is a vertical cross-sectional view of the first exemplary structure after formation of tubular semiconductor oxide spacers according to the first embodiment of the present disclosure.

Referring to FIG. 21, a sidewall surface of each pedestal channel portion 11 and a top surface of the substrate semiconductor layer 10 can be physically exposed below the bottommost first backside recess 143 after removal of the first and second sacrificial material layers (142, 242). An oxidation process can be performed to convert each physically exposed surface portion of the pedestal channel portions 11 into tubular semiconductor oxide spacers 116, and to convert each physically exposed surface portion of the substrate semiconductor layer 10 into planar semiconductor oxide portions 616.

Figure 22:
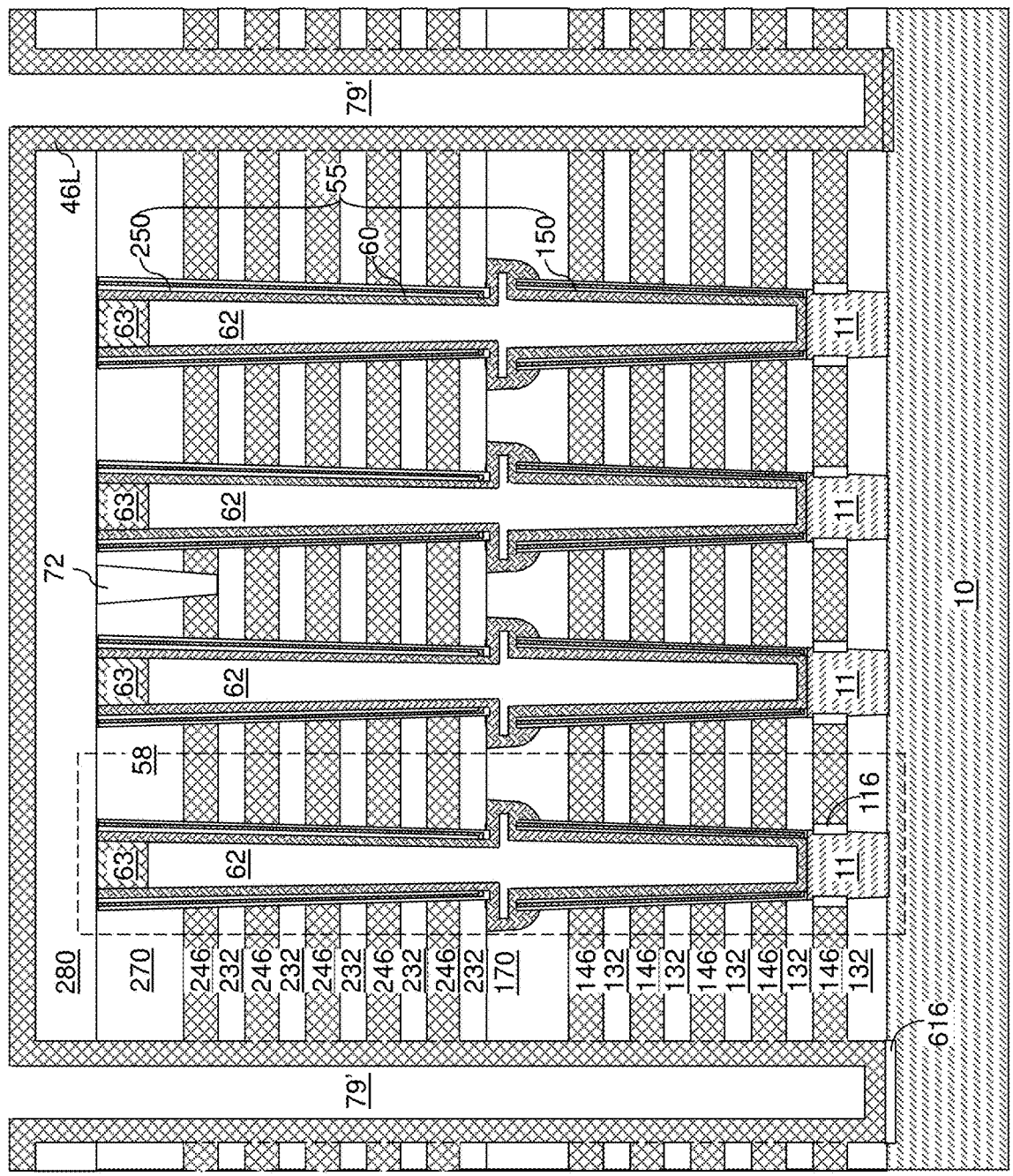
FIG. 22 is a vertical cross-sectional view of the first exemplary structure after deposition of a conductive material in the backside recesses and peripheral portions of the backside trenches according to the first embodiment of the present disclosure.

Referring to FIG. 22, a backside blocking dielectric layer (not shown) can be optionally deposited in the backside recesses (143, 243) and the backside trenches 79 and over the planarization dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (143, 243), on the sidewalls of the backside trench 79, and over the planarization dielectric layer 280. The at least one conductive material can include at least one metallic material, i.e., an electrically conductive material that includes at least one metallic element. A backside cavity 79' can be present within each unfilled volume of the backside trenches 79.

A plurality of first electrically conductive layers 146 can be formed in the plurality of first backside recesses 143, a plurality of second electrically conductive layers 246 can be formed in the plurality of second backside recesses 243, and a continuous metallic material layer 46L can be formed on the sidewalls of each backside trench 79 and over the planarization dielectric layer 280. In embodiments in which the first spacer material layers and the second spacer material layers are provided as first sacrificial material layers 142 and second sacrificial material layers 242, the first and second sacrificial material layers (142, 242) can be replaced with the first and second conductive material layers (146, 246), respectively. Specifically, each first sacrificial material layer 142 can be replaced with a portion of the backside blocking dielectric layer and a first electrically conductive layer 146, and each second sacrificial material layer 242 can be replaced with a portion of the backside blocking dielectric layer and a second electrically conductive layer 246. A backside cavity is present in the portion of each backside trench 79 that is not filled with the continuous metallic material layer 46L.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses (143, 243) can be a combination of titanium nitride layer and a tungsten fill material. In one embodiment, the metallic material can be deposited by chemical vapor deposition or atomic layer deposition.

Figure 23A:
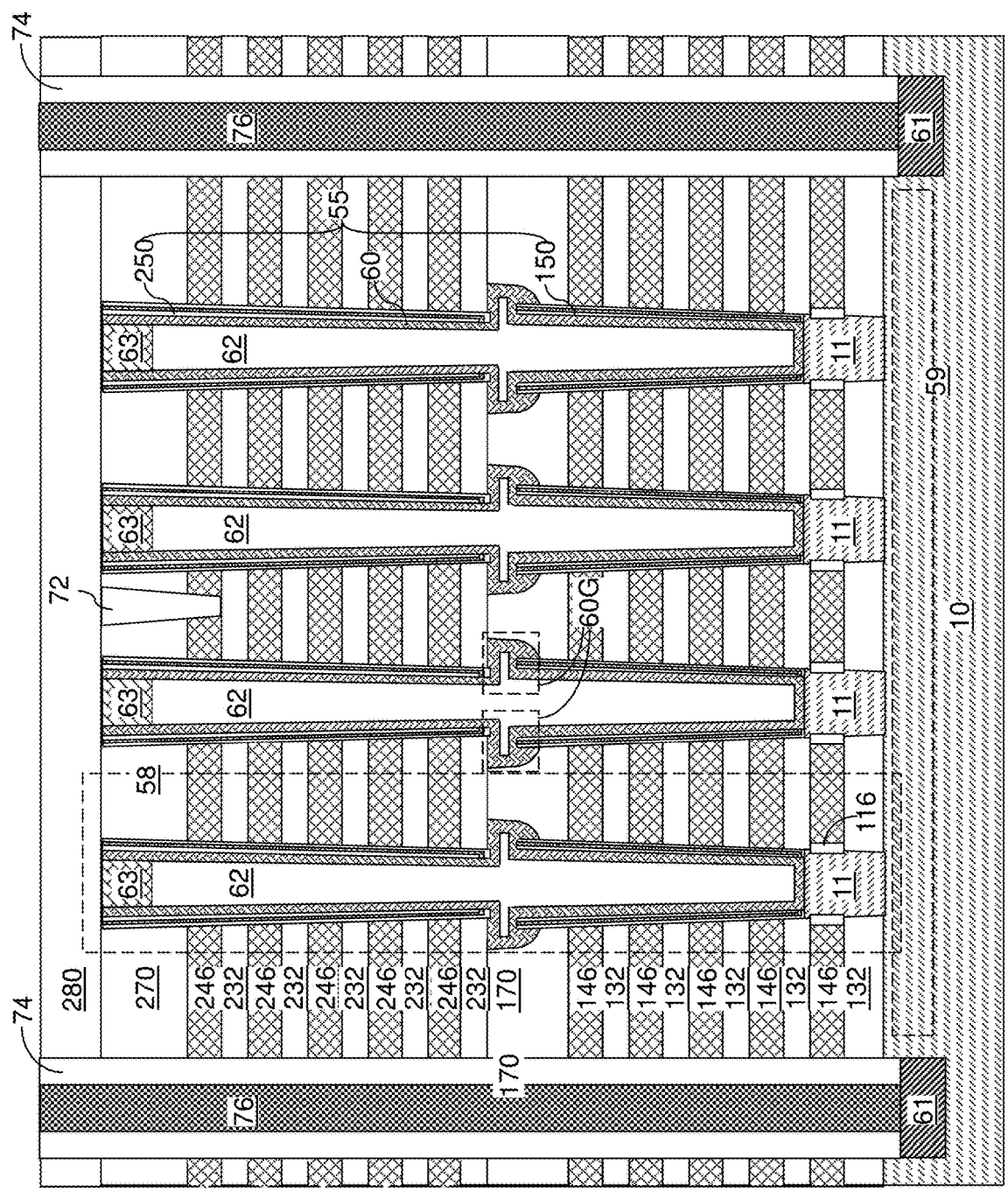
FIG. 23A is a vertical cross-sectional view of the first exemplary structure after removal of residual materials from the backside trenches, formation of source regions, and formation of insulating spacers and backside contact structures according to the first embodiment of the present disclosure.
Figure 23B:
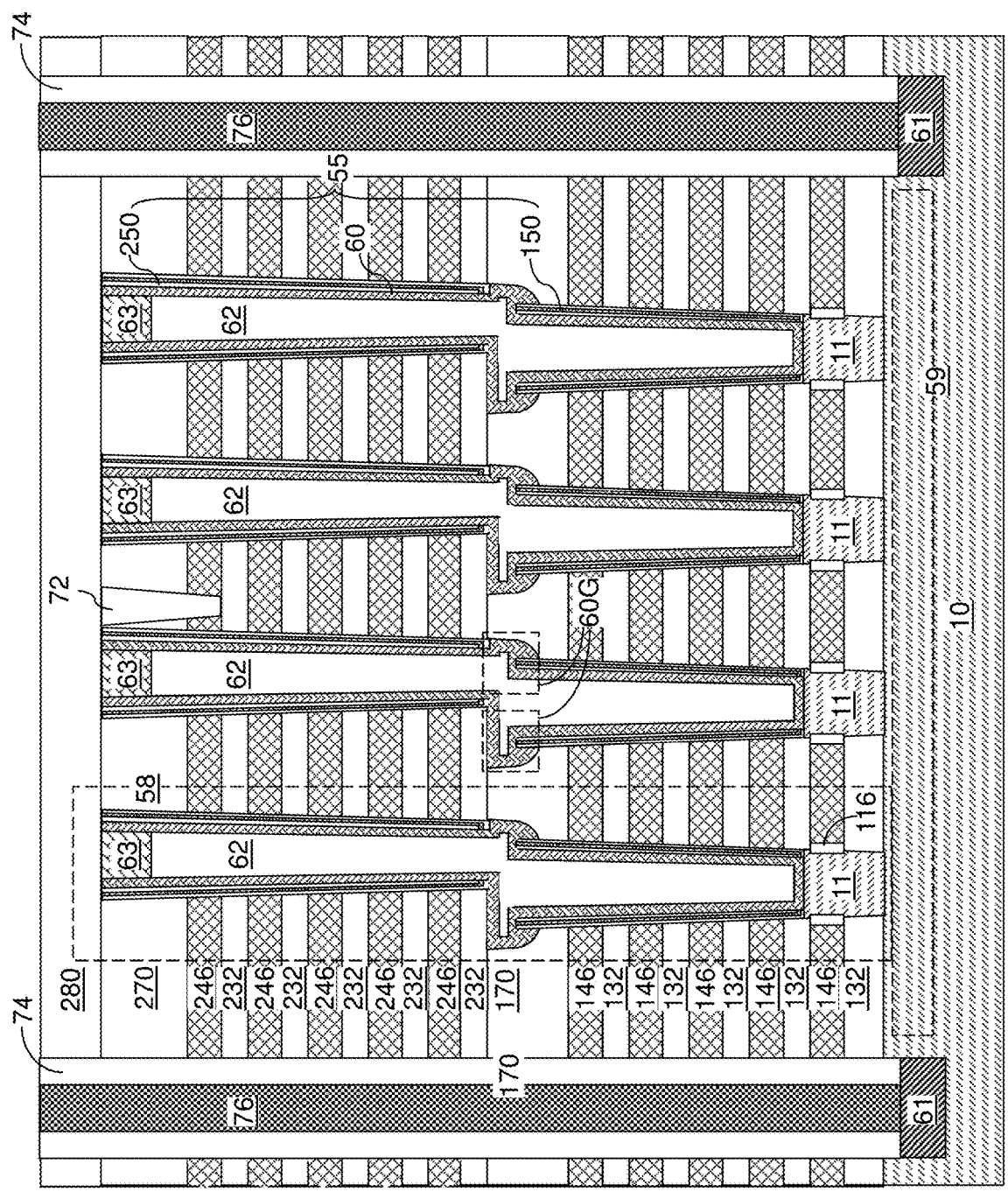
FIG. 23B is a vertical cross-sectional view of the first exemplary structure after removal of residual materials from the backside trenches, formation of source regions, and formation of insulating spacers and backside contact structures in case of misalignment between second-tier memory openings and first-tier memory openings according to the first embodiment of the present disclosure.

Referring to FIGS. 23A and 23B, residual material can be removed from each backside trench 79. Specifically, the deposited metallic material of the continuous metallic material layer 46L can be etched back from the sidewalls of each backside trench 79 and from above the planarization dielectric layer 280, for example, by an isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each electrically conductive layer (146, 246) can be a conductive line structure.

Each electrically conductive layer (146, 246) except the bottommost electrically conductive layer (i.e., the bottommost first electrically conductive layer 146) can function as a combination of a plurality of control gate electrodes located at a same level and a word line electrically interconnecting, i.e., electrically shorting, the plurality of control gate electrodes located at the same level. The control gate electrodes within each electrically conductive layer (146, 246) are the control gate electrodes for a vertical memory device including the memory stack structure 55.

The bottommost first electrically conductive layer 146 can be a source select gate electrode located over the bottommost insulating layer 132. The bottommost first electrically conductive layer 146 can control activation of a horizontal semiconductor channel 59 which is a portion of a semiconductor channel that extends between a source region 61 (which is previously formed or which will be subsequently formed underneath each backside trench 79) and drain regions 63. In one embodiment, the backside blocking dielectric layer may be present as a single continuous material layer. In another embodiment, the vertical portions of the backside blocking dielectric layer may be removed from within the backside trenches 79, and the backside blocking dielectric layer can have a plurality of physically disjoined backside blocking dielectric layer portions that are located at each level of the electrically conductive layers (146, 246). Generally, each of the first spacer material layers 142 and the second spacer material layers 242 is formed as, or is subsequently replaced with, a respective electrically conductive layer (146, 246).

Dopants of a second conductivity type, which is the opposite of the first conductivity type of the substrate semiconductor layer 10, can be implanted into a surface portion of the substrate semiconductor layer 10 to form a source region 61 underneath the bottom surface of each backside trench 79. Each surface region of the substrate semiconductor layer 10 located between a source region 61 and a pedestal channel portion 11 constitutes a horizontal semiconductor channel 59. An insulating spacer 74 including a dielectric material can be formed at the periphery of each backside trench 79, for example, by deposition of a conformal insulating material (such as silicon oxide) and a subsequent anisotropic etch. The planarization dielectric layer 280 may be thinned due to a collateral etch during the anisotropic etch that removes the vertical portions of horizontal portions of the deposited conformal insulating material.

A backside contact via structure 76 can be formed in the remaining volume of each backside trench 79, for example, by deposition of at least one conductive material and removal of excess portions of the deposited at least one conductive material from above a horizontal plane including the top surface of the planarization dielectric layer 80 by a planarization process such as chemical mechanical planarization or a recess etch. Optionally, each backside contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside trenches 79 and removing the deposited doped semiconductor material from upper portions of the backside trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the planarization dielectric layer 280. The planarization dielectric layer 280 can be thinned and removed during a latter part of the planarization process, which may employ chemical mechanical planarization (CMP), a recess etch, or a combination thereof. Each backside contact via structure 76 can be formed through the at least one-tier structure (132, 146, 232, 246) and on a source region 61 as a source contact via structure.

Figure 24A:
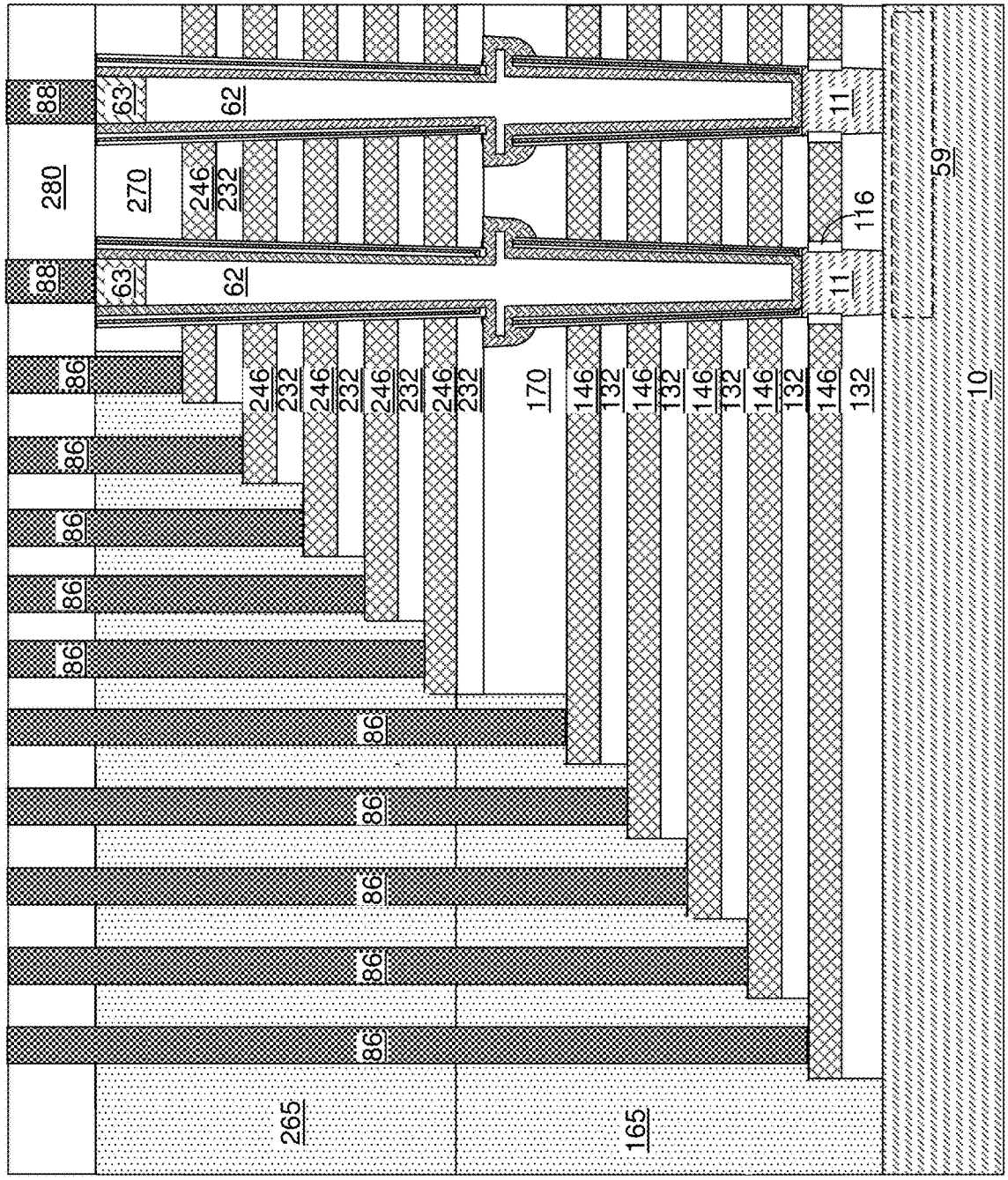
FIG. 24A is a vertical cross-sectional view of the first exemplary structure after formation of various additional contact via structures according to the first embodiment of the present disclosure.
Figure 24B:
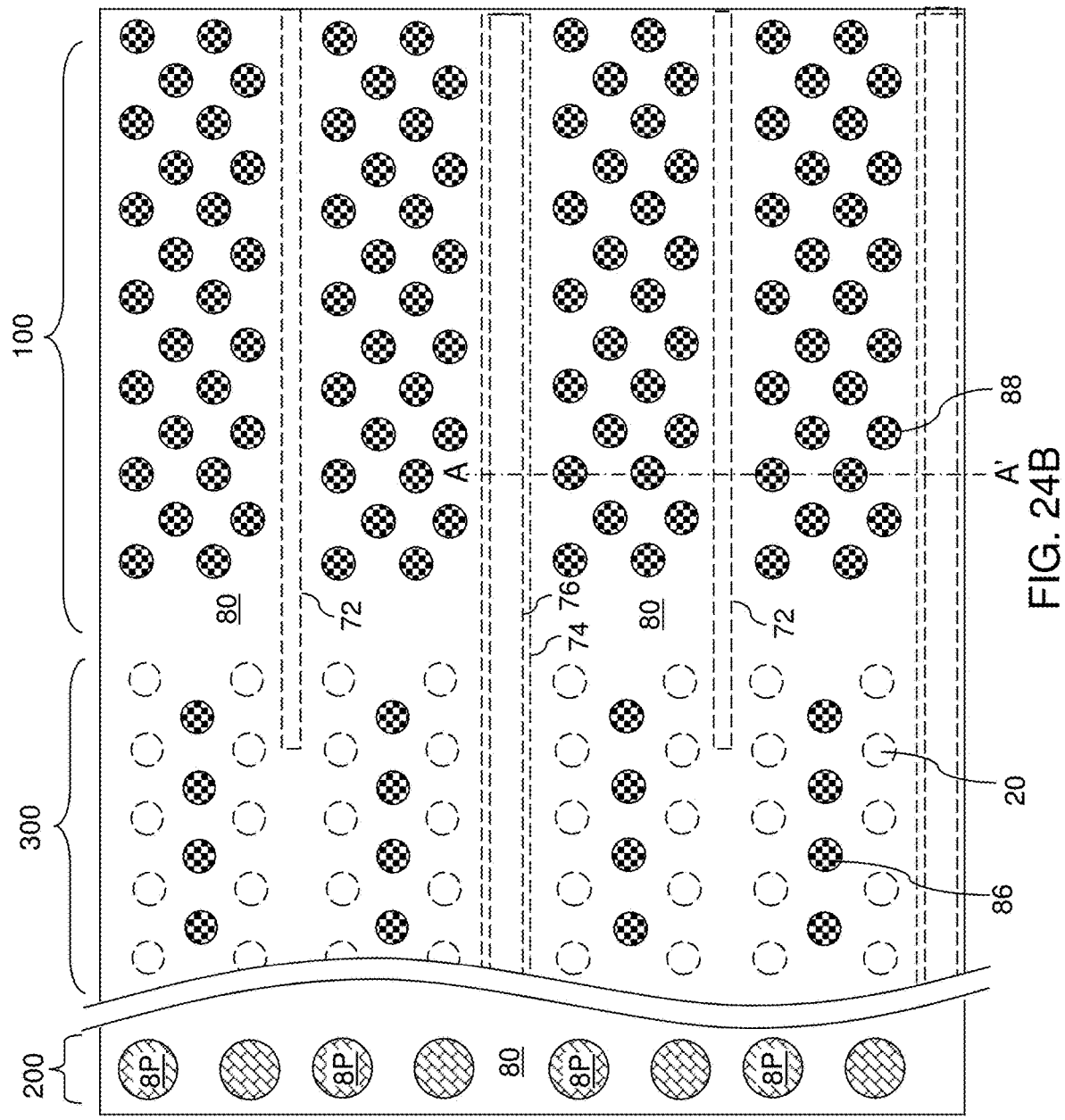
FIG. 24B is a top-down view of the first exemplary structure of FIG. 24A.

Referring to FIGS. 24A and 24B, the contact region 300 and the memory array region 100 are shown after formation of additional contact via structures, which can include drain contact via structures 88 that contact a respective drain region 63 and layer contact via structures 86 that contact a respective electrically conductive layer (146, 246). A first retro-stepped dielectric material portion 165 overlies first stepped surfaces of a first alternating stack (132, 146) of the first insulating layers 132 and the first electrically conductive layers 146 in the contact region 300. Further, a second retro-stepped dielectric material portion 265 overlies second stepped surfaces of a second alternating stack (232, 246) of the second insulating layers 232 and the second electrically conductive layers 246 in the contact region 300. Each layer contact via structure 86 can extend through the second retro-stepped dielectric material portion 265. A subset of the layer contact via structures 86 extends through the first retro-stepped dielectric material portion 165 and contacts a respective one of the first electrically conductive layers 146.

Peripheral device contact via structures 8P can be formed in a peripheral device region 200, and can vertically extend through the levels of the first-tier structure and the second-tier structure and provide electrical contact to semiconductor devices (such as field effect transistors) that are on the substrate semiconductor layer 10.

Figure 25:
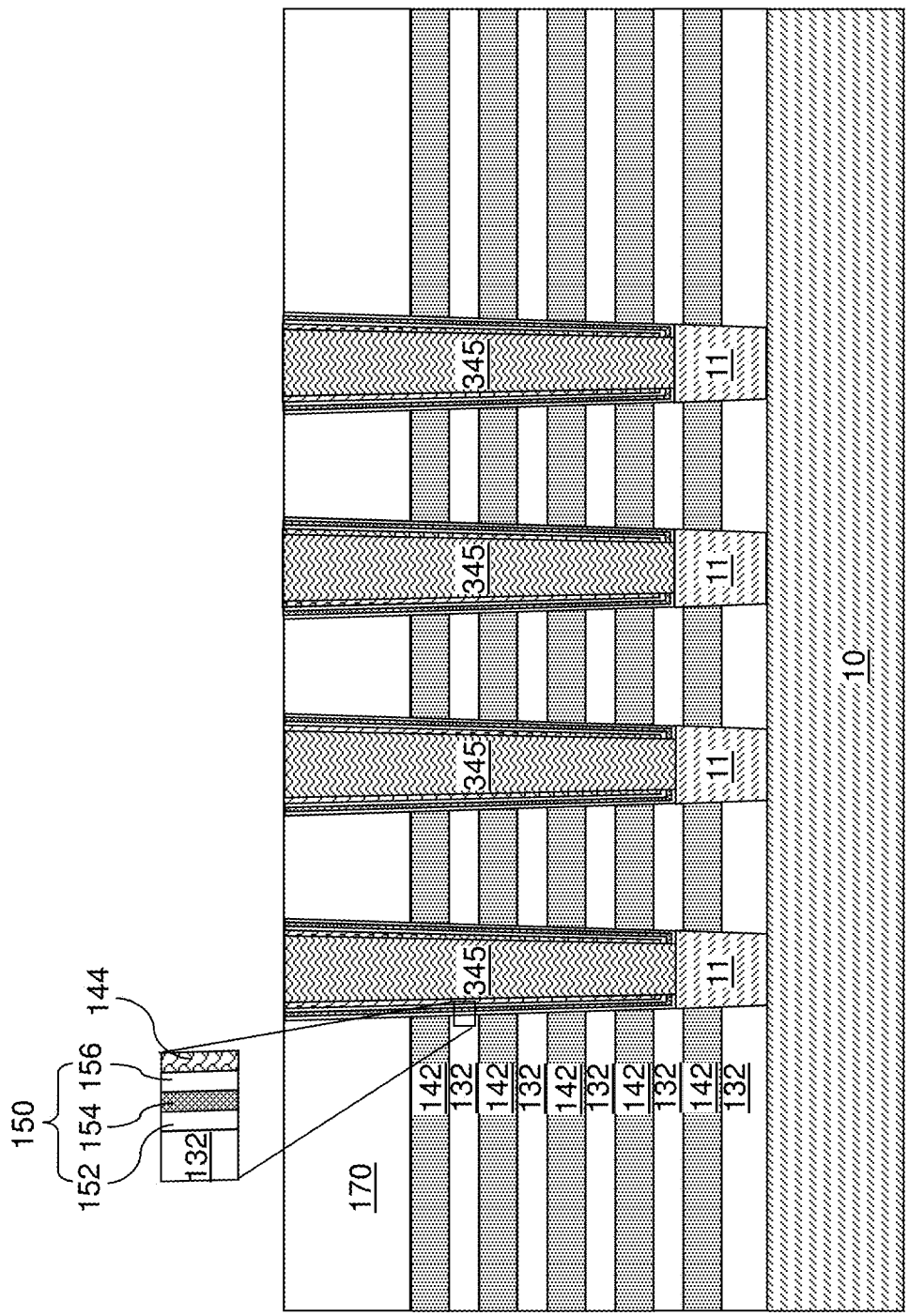
FIG. 25 is a vertical cross-sectional view of a second exemplary structure after formation of a first alternating stack of first insulating layers and first sacrificial material layers, first memory films, and first sacrificial fill structure according to a second embodiment of the present disclosure.

Referring to FIG. 25, a second exemplary structure according to a second embodiment of the present disclosure can be derived from the first exemplary structure of FIG. 6 by depositing a first sacrificial fill material as in the processing steps of FIG. 7, and by modifying the recess process of FIG. 7. Specifically, excess portions of the first sacrificial fill material can be recessed to the level of the horizontal plane including the top surface of the first insulating cap layer 170 by a recess etch process. Each remaining portion of the first sacrificial fill material in the first memory openings 149 constitutes a sacrificial fill material structure 345. In one embodiment, the top surface of each sacrificial fill material structure 345 can be formed at the horizontal plane including the top surface of the first insulating cap layer 170. The top portion of each first cover material tube 144 may be at the horizontal plane including the top surface of the first insulating cap layer 170.

Figure 26:
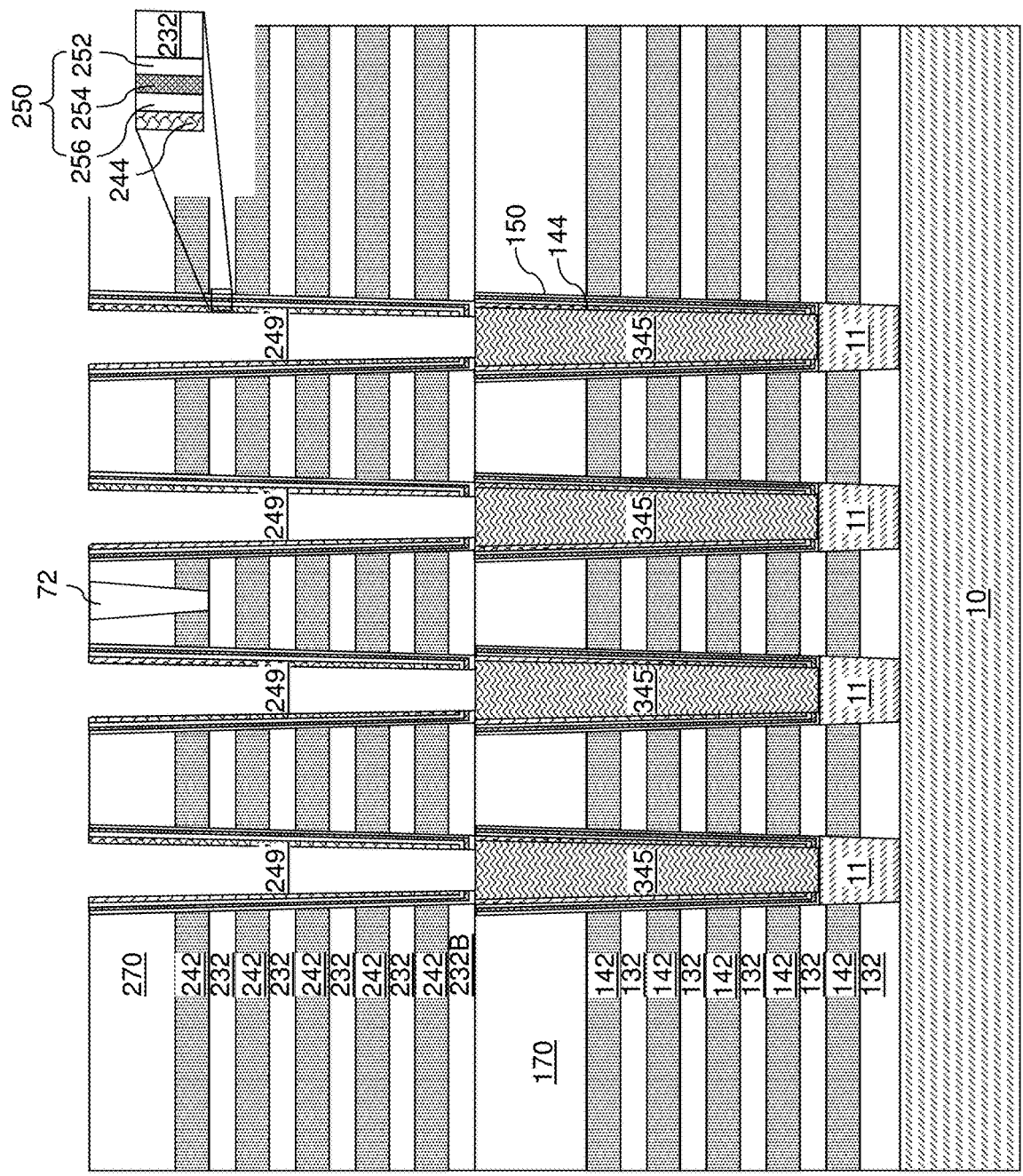
FIG. 26 is a vertical cross-sectional view of the second exemplary structure after formation of second-tier memory openings, second memory films, and second cover material layers according to the second embodiment of the present disclosure.

Referring to FIG. 26, the processing steps of FIGS. 11, 12A and 12B, 13, and 14 can be subsequently performed to form a second alternating stack (232, 242), second-tier memory openings 249, second memory films 250, and second cover material tubes 244 as in the first embodiment. In the second embodiment, a bottommost second insulating layer 232B can contact a horizontal top surface of each sacrificial fill structure 345 upon formation of the second alternating stack (232, 242).

Figure 27A:
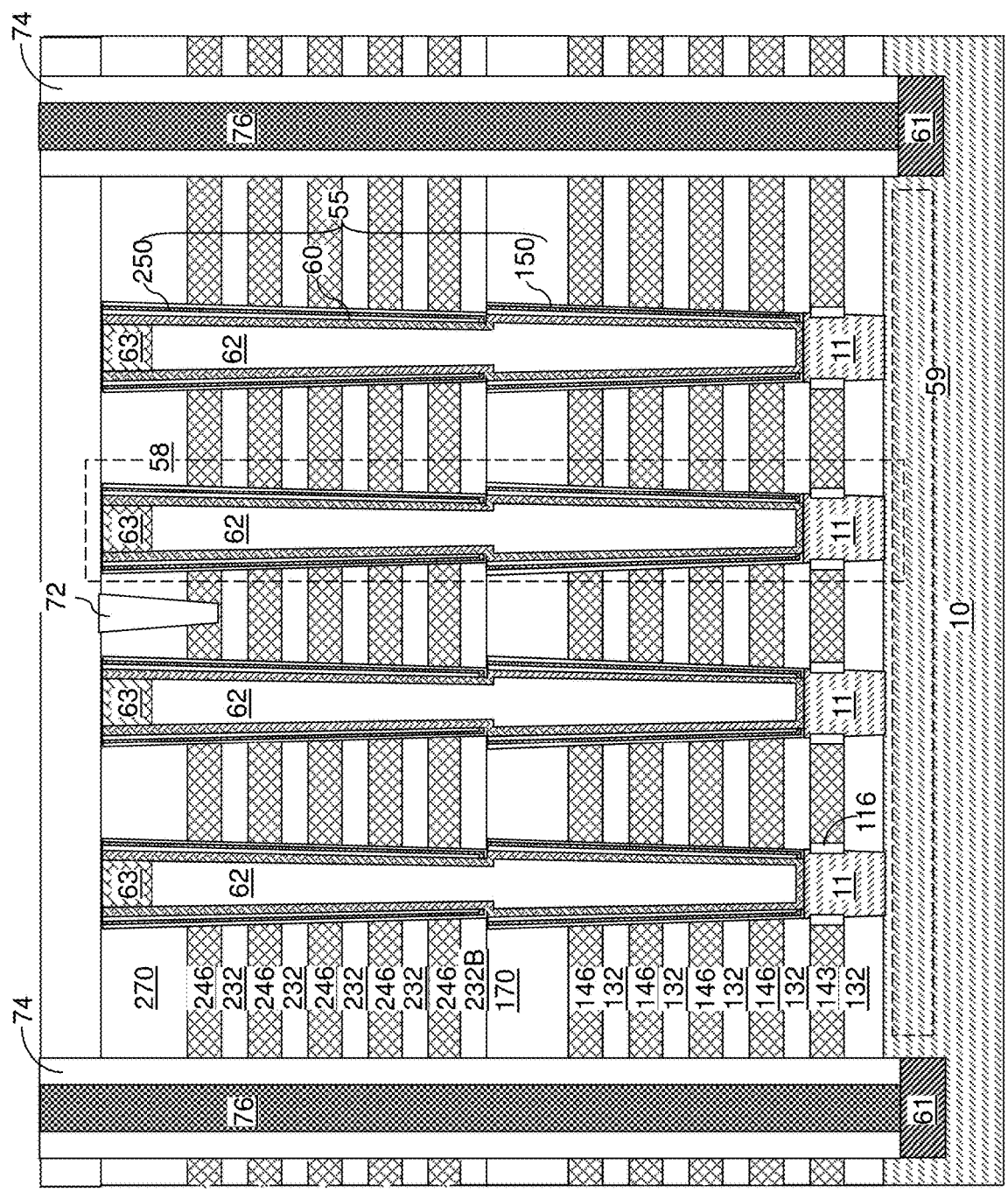
FIG. 27A is a vertical cross-sectional view of the second exemplary structure after removal of residual materials from the backside trenches, formation of source regions, and formation of insulating spacers and backside contact structures according to the second embodiment of the present disclosure.
Figure 27B:
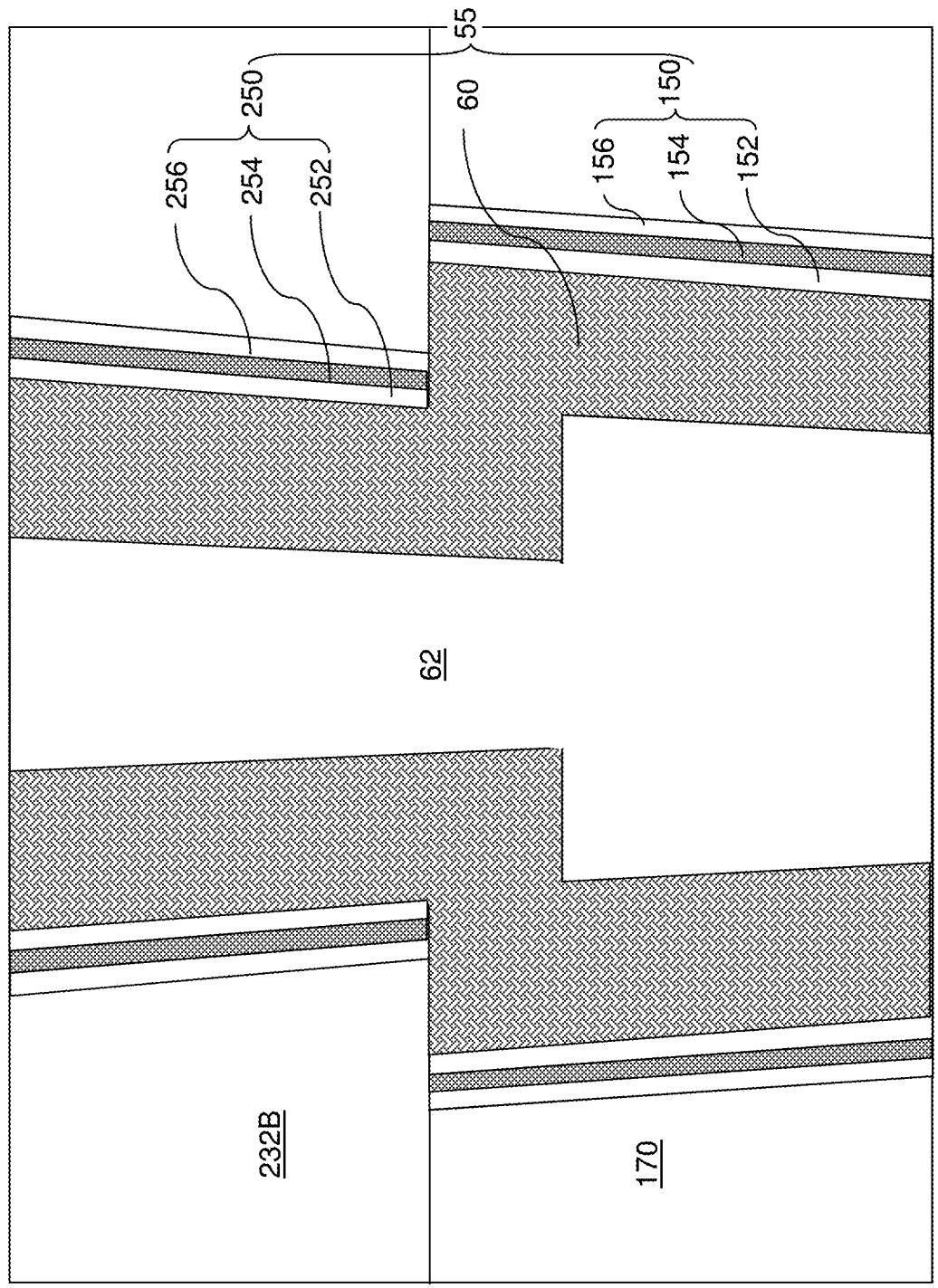
FIG. 27B is a magnified view of a joint region of a memory opening fill structure of FIG. 27A.
Figure 28A:
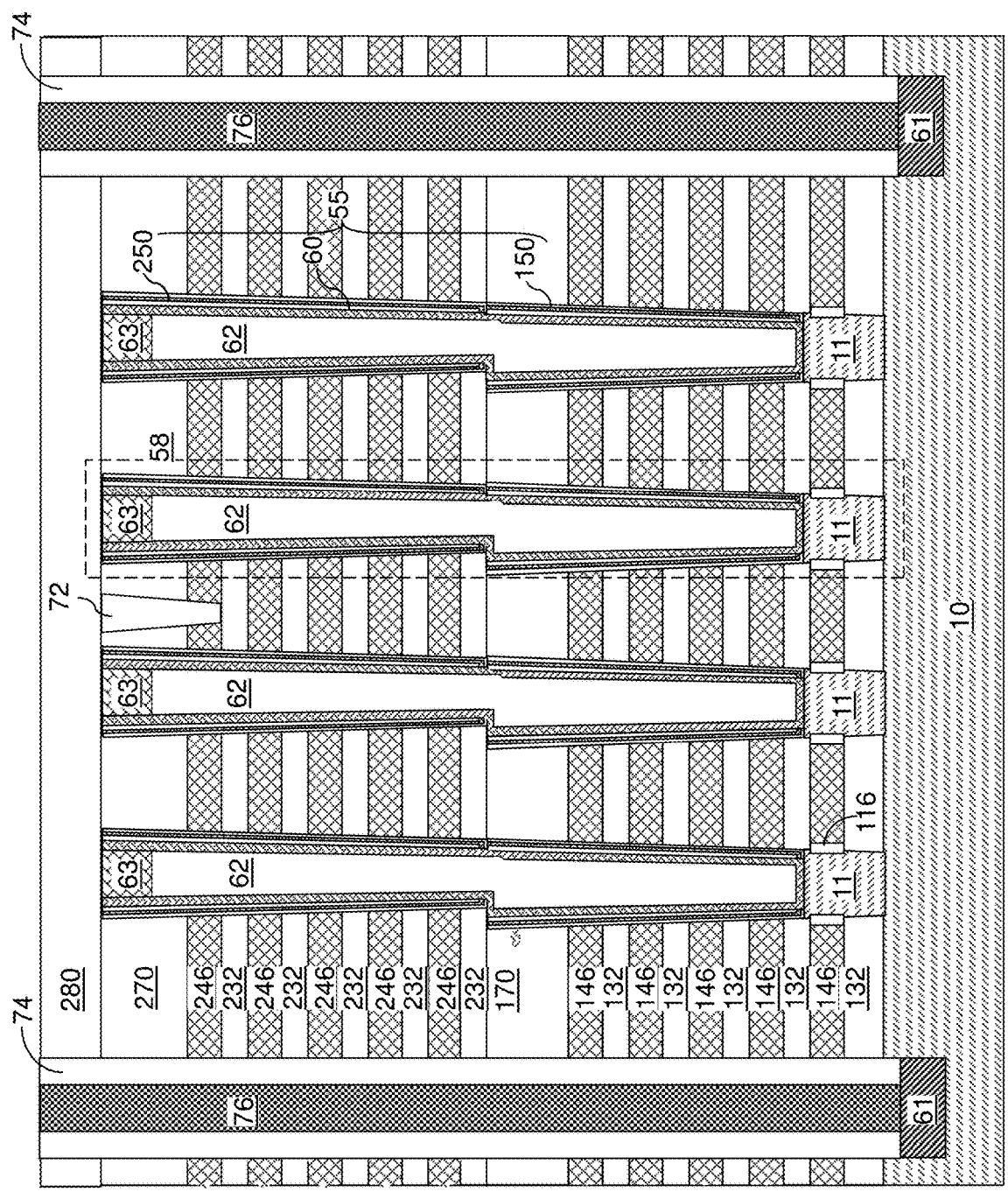
FIG. 28A is a vertical cross-sectional view of the second exemplary structure after removal of residual materials from the backside trenches, formation of source regions, and formation of insulating spacers and backside contact structures in case of misalignment between the second-tier memory openings and the first-tier memory openings according to the second embodiment of the present disclosure.
Figure 28B:
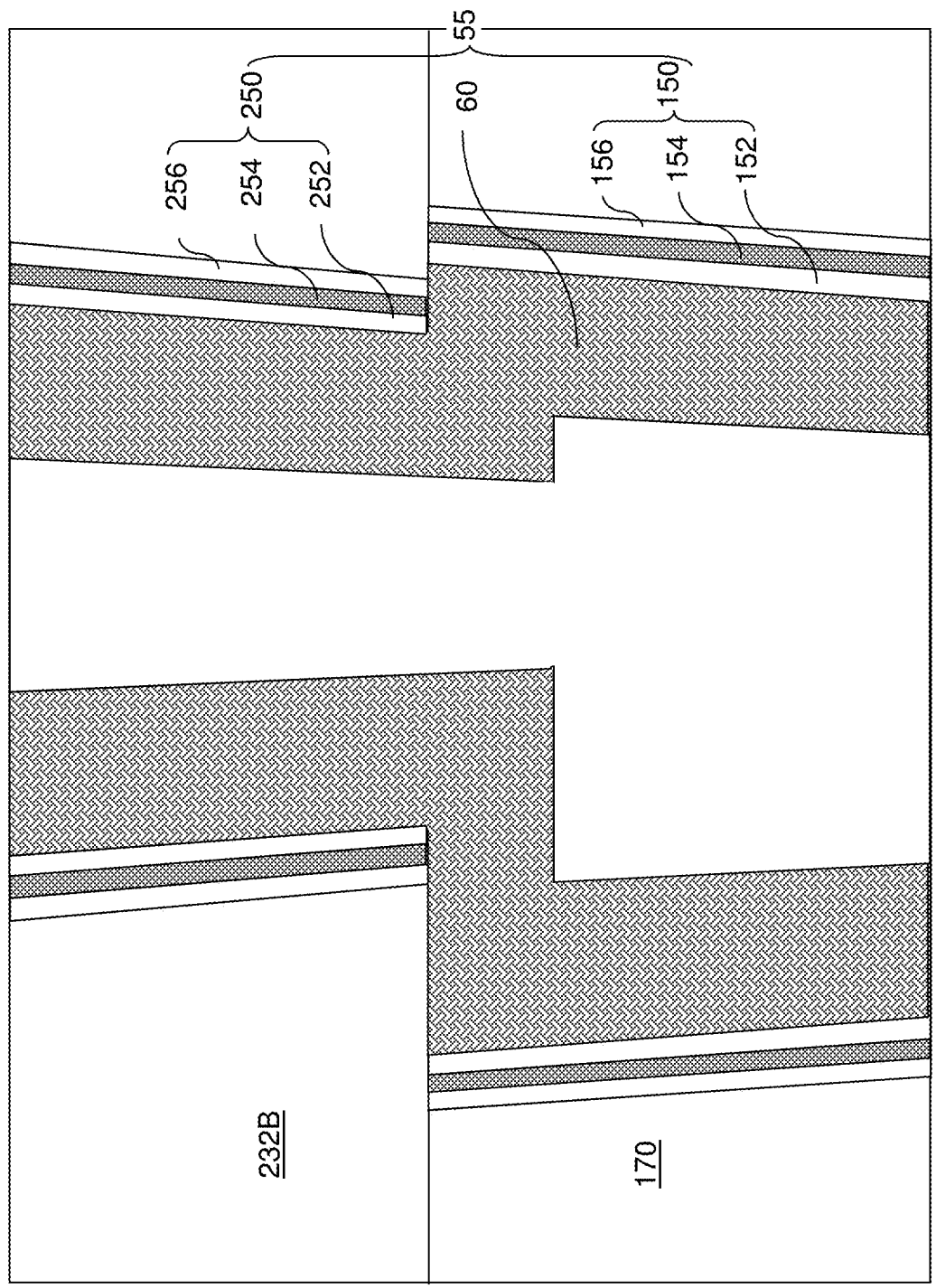
FIG. 28B is a magnified view of a joint region of a memory opening fill structure of FIG. 28A.

Referring to FIGS. 27A, 27B, 28A, and 28B, the processing steps of FIGS. 15, 16, 17, 18A and 18B, 19, 20, 21, 22, and 23A and 23B can be subsequently performed to form memory opening fill structures 58, first and second electrically conductive layers (146, 246), source regions 61, insulating spacers 74, and backside contact via structures 76. FIGS. 27A and 27B illustrate an embodiment in which the overlay variation between the pattern of the first-tier memory openings 149 and the second-tier memory openings 249 is zero, and FIGS. 28A and 28B illustrate an embodiment in which the overlay variation between the pattern of the first-tier memory openings 149 and the second-tier memory openings 249 is at a maximum value.

In the second exemplary structure, the bottommost second insulating layer 232B of the second insulating layers 232 contacts a horizontal surface of the semiconductor channel 60 upon formation of the semiconductor channel 60 within each memory opening fill structure 58. An outer periphery of a horizontal surface of the semiconductor channel 60 adjoins an upper outer periphery of a vertically extending portion of the semiconductor channel 60 that extends through each of the first electrically conductive layers 146 except one or more bottommost first electrically conductive layers 146.

Referring to all drawings and according to various embodiments of the present disclosure, a monolithic three-dimensional memory device comprises: a first alternating stack of first insulating layers 132 and first electrically conductive layers 146 located over a top surface of a substrate 10, an insulating cap layer 170 overlying the first alternating stack (132, 146); a second alternating stack of second insulating layers 232 and second electrically conductive layers 246 overlying the insulating cap layer 170; a memory opening (149, 249) extending through the second alternating stack (232, 246), the insulating cap layer 170, and the first alternating stack (132, 146); and a memory stack structure 55 located within the memory opening (149, 249) and comprising a semiconductor channel 60, a first memory film 150 laterally surrounding the semiconductor channel 60 and embedded within the first alternating stack (132, 146), and a second memory film 250 laterally surrounding semiconductor channel 60 and embedded within the second alternating stack (232, 246), wherein the second memory film 250 is not in direct contact with the first memory film 150. For example, the second memory film 250 is vertically spaced from the first memory film 150 as in the first exemplary structure is laterally offset outward from the first memory film 150 as in the second exemplary structure.

In one embodiment, the first memory film 150 comprises a first tunneling dielectric 156; the second memory film 250 comprises a second tunneling dielectric 256; and the second tunneling dielectric 256 is not in direct contact with the first tunneling dielectric 156.

In one embodiment, the semiconductor channel 60 continuously vertically extends at least from a level of a second bottommost electrically conductive layer 146 within the first alternating stack (132, 146) to a level of a topmost electrically conductive layer 246 within the second alternating stack (232, 246). In one embodiment, a horizontal surface 60H of the semiconductor channel 60 directly contacts a bottommost second insulating layer 232B of the second insulating layers 232 within the second alternating stack (232, 246).

In one embodiment, the horizontal surface 60H of the semiconductor channel 60 is coplanar with a top surface of the insulating cap layer 170. In one embodiment, an outer periphery of the horizontal surface 60H of the semiconductor channel 60 is located outside of, and does not contact, an outer bottom periphery of the second memory film 250.

In one embodiment, the monolithic three-dimensional memory device further comprises a first retro-stepped dielectric material portion 165 overlying first stepped surfaces of the first alternating stack (132, 146); a second retro-stepped dielectric material portion 265 overlying second stepped surfaces of the second alternating stack (232, 246); and layer contact via structures 86 extending at least through the second retro-stepped dielectric material portion 265 and contacting top surfaces of a respective one of the first and second electrically conductive layers (146, 246).

In one embodiment, the monolithic three-dimensional memory structure comprises a monolithic three-dimensional NAND memory device. The first and second electrically conductive layers (146, 246) can comprise, or can be electrically connected to, a respective word line of the monolithic three-dimensional NAND memory device. The substrate 10 can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprise a plurality of semiconductor channels (59, 11, 60). At least one end portion of each of the plurality of semiconductor channels (59, 11, 60) extends substantially perpendicular to a top surface of the substrate 10. The array of monolithic three-dimensional NAND strings can comprise a plurality of charge storage elements. Each charge storage element can be located adjacent to a respective one of the plurality of semiconductor channels (59, 11, 60). The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

The semiconductor structures of the embodiments of the present disclosure minimize collateral etch damage to the first memory films 150 by covering the first memory films 150 with the sacrificial fill material structures {(145, 147), 345} during an anisotropic etch process that patterns the second memory film layer 250L. Further, the first cover material tubes 144, if employed, can protect the first memory films 150 during the etch process that removes the sacrificial fill material structures {(145, 147), 345}. In addition, the second cover material tubes 244, if employed, can protect the second memory films 250 until removal of the second cover material tubes 244 by an isotropic etch process. Thus, collateral damage to the first memory films 150 and the second memory films 250 can be minimized by the methods of the embodiments of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
   a first alternating stack of first insulating layers and first electrically conductive layers located over a top surface of a substrate;
   an insulating cap layer overlying the first alternating stack;
   a second alternating stack of second insulating layers and second electrically conductive layers overlying the insulating cap layer;
   a memory opening extending through the second alternating stack, the insulating cap layer, and the first alternating stack; and
   a memory stack structure located within the memory opening and comprising a semiconductor channel, a first memory film laterally surrounding the semiconductor channel and embedded within the first alternating stack, and a second memory film laterally surrounding semiconductor channel and embedded within the second alternating stack,
   wherein the second memory film is not in direct contact with the first memory film;
   wherein the semiconductor channel continuously vertically extends at least from a level of a second bottommost electrically conductive layer within the first alternating stack to a level of a topmost electrically conductive layer within the second alternating stack;
   wherein a horizontal surface of the semiconductor channel directly contacts a bottommost second insulating layer of the second insulating layers within the second alternating stack;
   wherein the horizontal surface of the semiconductor channel is coplanar with a top surface of the insulating cap layer;
   wherein the semiconductor channel comprises:
      a first vertically-extending portion located within the first alternating stack;
      a second vertically-extending portion located within the second alternating stack; and
      a ledge portion connecting the first vertically-extending portion and the second vertically-extending portion, located within the insulating cap layer, and including the horizontal surface of the semiconductor channel that contacts the bottommost second insulating layer of the second insulating layers within the second alternating stack; and
   wherein the ledge portion comprises:
      a cylindrical sidewall of the semiconductor channel that contacts a sidewall of the insulating cap layer;
      a convex surface that adjoins a bottom end of the cylindrical sidewall and having a periphery that adjoins an outer sidewall of the first memory film; and
      a cylindrical contact surface that adjoins the convex surface and contacting the outer sidewall of the first memory film.

2. The monolithic three-dimensional memory device of claim 1, wherein:
   the first memory film comprises a first tunneling dielectric;
   the second memory film comprises a second tunneling dielectric; and
   the second tunneling dielectric is not in direct contact with the first tunneling dielectric.

3. The monolithic three-dimensional memory device of claim 1, wherein:
   the monolithic three-dimensional memory structure comprises a monolithic three-dimensional NAND memory device;
   the first and second electrically conductive layers comprise, or are electrically connected to, a respective word line of the monolithic three-dimensional NAND memory device;
   the substrate comprises a silicon substrate;
   the monolithic three-dimensional NAND memory device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon; and
   the array of monolithic three-dimensional NAND strings comprises:
   a plurality of semiconductor channels, wherein at least one end portion of each of the plurality of semiconductor channels extends substantially perpendicular to a top surface of the substrate;
   a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

4. A monolithic three-dimensional memory device, comprising:
  a first alternating stack of first insulating layers and first electrically conductive layers located over a top surface of a substrate;
  an insulating cap layer overlying the first alternating stack;
  a second alternating stack of second insulating layers and second electrically conductive layers overlying the insulating cap layer;
  a memory opening extending through the second alternating stack, the insulating cap layer, and the first alternating stack; and
  a memory stack structure located within the memory opening and comprising a semiconductor channel, a first memory film laterally surrounding the semiconductor channel and embedded within the first alternating stack, and a second memory film laterally surrounding semiconductor channel and embedded within the second alternating stack,
  wherein the second memory film is not in direct contact with the first memory film;
  wherein the semiconductor channel continuously vertically extends at least from a level of a second bottommost electrically conductive layer within the first alternating stack to a level of a topmost electrically conductive layer within the second alternating stack;
  wherein a horizontal surface of the semiconductor channel directly contacts a bottommost second insulating layer of the second insulating layers within the second alternating stack;
  wherein the horizontal surface of the semiconductor channel is coplanar with a top surface of the insulating cap layer;
  wherein the semiconductor channel comprises:
    a first vertically-extending portion located within the first alternating stack;
    a second vertically-extending portion located within the second alternating stack; and
    a ledge portion connecting the first vertically-extending portion and the second vertically-extending portion, located within the insulating cap layer, and including the horizontal surface of the semiconductor channel that contacts the bottommost second insulating layer of the second insulating layers within the second alternating stack; and further comprising a dielectric core located within the semiconductor channel and including a laterally protruding portion embedded within the insulating cap layer and having a top surface that contacts a first region of the ledge portion of the semiconductor channel and having a bottom surface that contacts a second region of the ledge portion of the semiconductor channel.

5. The monolithic three-dimensional memory device of claim 4, wherein:
  the first memory film comprises a first tunneling dielectric;
  the second memory film comprises a second tunneling dielectric; and
  the second tunneling dielectric is not in direct contact with the first tunneling dielectric.

6. The monolithic three-dimensional memory device of claim 4, wherein:
  the monolithic three-dimensional memory structure comprises a monolithic three-dimensional NAND memory device;
  the first and second electrically conductive layers comprise, or are electrically connected to, a respective word line of the monolithic three-dimensional NAND memory device;
  the substrate comprises a silicon substrate;
  the monolithic three-dimensional NAND memory device comprises an array of monolithic three-dimensional NAND strings over the silicon substrate;
  at least one memory cell in a first device level of the array of monolithic three-dimensional NAND strings is located over another memory cell in a second device level of the array of monolithic three-dimensional NAND strings;
  the silicon substrate contains an integrated circuit comprising a driver circuit for the memory device located thereon; and
  the array of monolithic three-dimensional NAND strings comprises:
    a plurality of semiconductor channels, wherein at least one end portion of each of the plurality of semiconductor channels extends substantially perpendicular to a top surface of the substrate;
    a plurality of charge storage elements, each charge storage element located adjacent to a respective one of the plurality of semiconductor channels; and
    a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *